(12) United States Patent
Stewart et al.

(10) Patent No.: US 6,980,184 B1
(45) Date of Patent: Dec. 27, 2005

(54) DISPLAY DEVICES AND INTEGRATED CIRCUITS

(75) Inventors: Roger Green Stewart, Morgan Hill, CA (US); Edward Boling, Fremont, CA (US); Jeffrey J. Jacobsen, Hollister, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 693 days.

(21) Appl. No.: 09/671,659

(22) Filed: Sep. 27, 2000

(51) Int. Cl.[7] .............................................. G09G 3/36
(52) U.S. Cl. ......................................... 345/87; 326/38
(58) Field of Search ....... 174/261; 257/99; 326/38–44; 438/597

(56) References Cited

U.S. PATENT DOCUMENTS

| | | |
|---|---|---|
| 3,866,209 A | 2/1975 | Weimer |
| 3,967,253 A | 6/1976 | Tsuruishi |
| 4,368,467 A | 1/1983 | Unotoro et al. |
| 4,677,528 A | 6/1987 | Miniet |
| 4,817,850 A | 4/1989 | Wiener-Avnear et al. |
| 5,032,896 A | 7/1991 | Little et al. |
| 5,138,436 A | 8/1992 | Koepf et al. |

(Continued)

FOREIGN PATENT DOCUMENTS

EP          0351825 A2    1/1990

(Continued)

OTHER PUBLICATIONS

Yeh, Hsi-Jen J. et al., "New fabrication technique for the integration of large area optoelectronic display panels," Conference on Lasers and Electro-Optics (CLEO), New York, May 8-13, 1994, IEEE, Document No. XP 000619412 (pp. 191-192).

(Continued)

*Primary Examiner*—Dennis-Doon Chow
*Assistant Examiner*—Srilakshmi K. Kumar
(74) *Attorney, Agent, or Firm*—Blakely, Sokoloff, Taylor & Zafman LLP

(57) ABSTRACT

Integrated circuits, assemblies with integrated circuits, display devices and electrical circuits. There are various different aspects and embodiments of these apparatuses described herein. According to one aspect, a display device includes a plurality of display drivers which includes a serial shift register, wherein the display drivers are located in the display area of the display device which is viewable. According to another aspect, an integrated circuit, which has a plurality of functionally symmetric interface pads, includes an instruction decoder which decodes instructions received through at least one of the pads. In another aspect, an integrated circuit (IC) includes a position detector which detects a position of the IC relative to a receptor substrate and provides a signal which is determined by the position; this IC may be used in an assembly which includes the receptor substrate. In another aspect, an IC includes a position detector which detects a position of the IC relative to a receptor substrate and also includes a configurable pad which is configurable, depending upon the position as one of at least two of the following: an input pad, an output pad, or a no-operation pad. According to another aspect, a layout of an IC has a plurality of functionally symmetric interface pads wherein two such pads are configurable pads. According to another aspect, an assembly includes a receptor substrate and an IC attached to the substrate, and the IC includes a first logic circuit which provides a first function, a second logic circuit which provides a second function, and a selector which selects between the two functions such that the IC performs only the selected function. Other aspects and methods are also described.

7 Claims, 28 Drawing Sheets

U.S. PATENT DOCUMENTS

| | | | |
|---|---|---|---|
| 5,363,118 | A | 11/1994 | Okumura |
| 5,445,741 | A | 8/1995 | Dilla et al. |
| 5,447,886 | A | 9/1995 | Rai |
| 5,545,291 | A | 8/1996 | Smith et al. |
| 5,572,211 | A | 11/1996 | Erhart et al. |
| 5,585,676 | A | 12/1996 | Uda et al. |
| 5,627,557 | A | 5/1997 | Yamaguchi et al. |
| 5,719,591 | A | 2/1998 | Callahan, Jr. et al. |
| 5,824,186 | A * | 10/1998 | Smith et al. ........ 438/597 |
| 6,011,693 | A | 1/2000 | Gore |
| 6,194,667 | B1 * | 2/2001 | Jimarez et al. ...... 174/261 |
| 6,262,594 | B1 * | 7/2001 | Cheung et al. ...... 326/38 |
| 6,326,647 | B1 * | 12/2001 | Chiu ................ 257/99 |

FOREIGN PATENT DOCUMENTS

| | | | |
|---|---|---|---|
| EP | | 0 747 948 A2 | 12/1996 |
| WO | | 00/49658 A1 | 8/2000 |

OTHER PUBLICATIONS

PCT Invitation Pay Additional Fees for PCT/US01/30784, mailed Apr. 8, 2002 (8 pgs).

Cohn, M., et al., "Self-Assembling Electrical Networks: An Application of Micromachining Technology," Department of Electrical Engineering and Computer Sciences, Department of Engineering, Univerisity of Berkeley, IEEE Int. Solid-State Sens. Actuators Conf., San Francisco, CA, 1991, pp. 490-493.

* cited by examiner

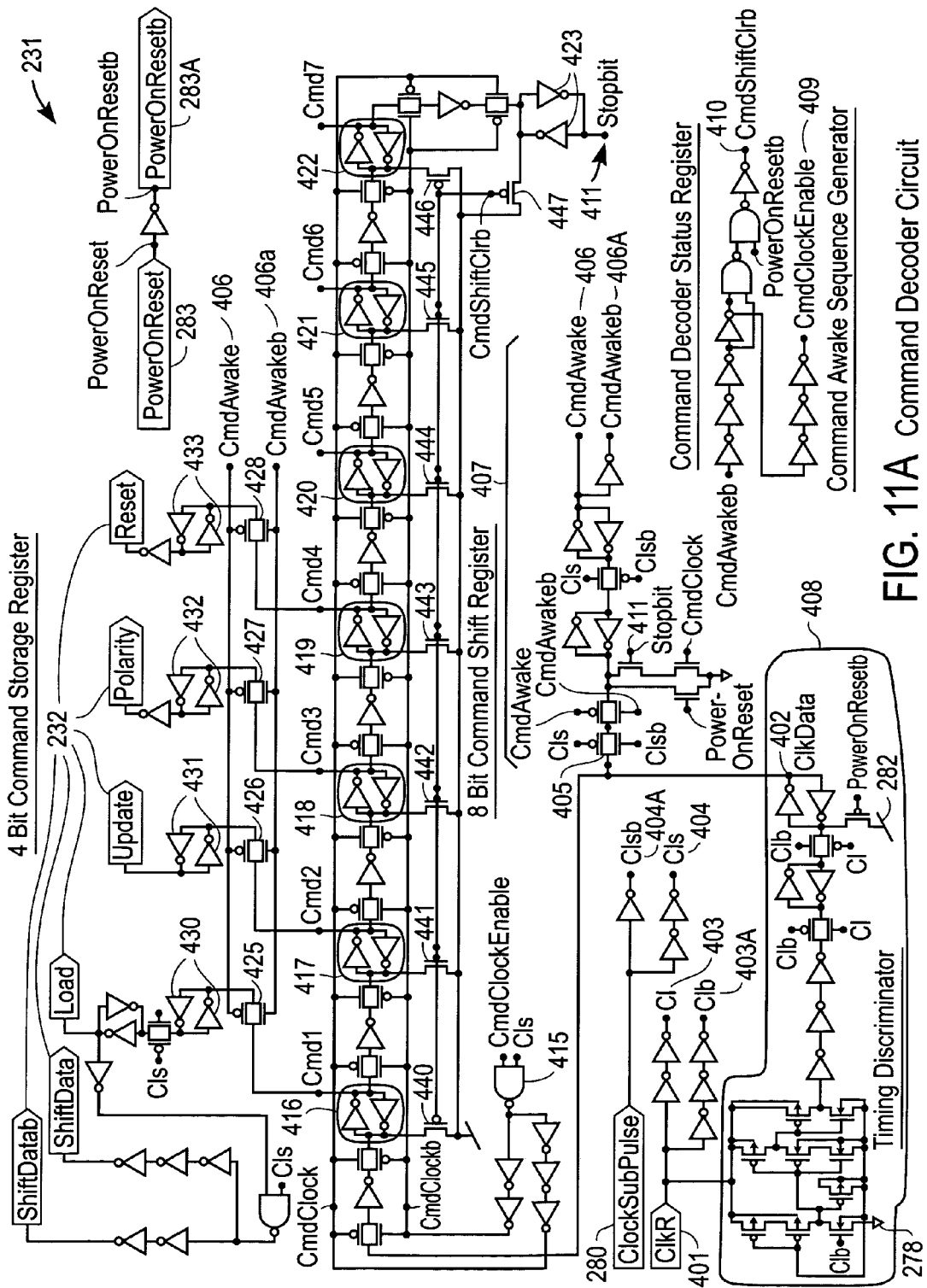
FIG. 11A Command Decoder Circuit

- n is the total number of data values for all daisy-chained device blocks. (example: n = 32 for 4 device blocks).
- data must be low upon start-up and through the first command sequence.

DISPLAY DEVICES AND INTEGRATED CIRCUITS

GOVERNMENT RIGHTS NOTICE

This invention was made with government support with at least one of these contracts: Grant (Contract) Nos. AFOSR 91-0327; F49620-92-J-059-1; F33615-96-C-5111 with USAF/AFMC/ASC; DAA016-00-C-9234 USAMCAC (US Army); Northrop Grumman PO #8200014995 (subcontract, NOOO14-99-C-0395 (prime)); North Dakota State University Subcontract #4080, DMEA 90-01-C-0009 (prime) and University of Alaska, Fairbanks PO#FP201509 (subcontract), DMEA 90-01-C-0009 (prime). The Government has certain rights to this invention.

FIELD OF THE INVENTION

The present invention relates to devices and methods for handling information, and more particularly, in certain embodiments, to display devices and also to other types of apparatuses such as integrated circuits with position detectors and other apparatuses.

BACKGROUND OF THE INVENTION

While the present invention has many aspects and embodiments, this section will focus on those aspects which relate to display devices. While there are a large number of various different types of display devices, one very common display device utilizes pixel electrodes to control a display medium such as a liquid crystal layer in order to create an image. These pixel electrodes may control other types of display media such as electrophoretic display media or organic light emitting diodes (OLED). Typically, a pixel electrode works by creating locally an electric field relative to another electrode. A display medium is sandwiched between the two electrodes and reacts to this electric field. Well known examples of such types of displays are the active matrix liquid crystal displays used in modern laptop computers.

FIG. 1 shows an example of a backplane for an active matrix display in the prior art. As is well known, a plurality of pixel electrodes, such as pixel electrode 9C, are arranged in an array of rows and columns. Each row of pixel electrodes is controlled by a row electrode such as row electrodes 2, 3, and 4. At least one transistor device is coupled to each pixel electrode in order to control the updating of new data to the pixel electrode in order to change the image being displayed. For example, as shown in FIG. 1, the field effect transistor (FET) 9A couples the pixel electrode 9C to the data line 1 on column 5 when row 2 receives a high voltage signal (e.g. 5 volts), causing the data value provided on column 5 to be stored onto the capacitor 9B which in turn causes the storage of a voltage value on the pixel electrode 9C. As is known in the art, each row receives a plurality of data in parallel substantially simultaneously as each row's signal line goes high, causing the gate electrode to allow the transistor device to conduct, thereby causing the data from the associated column to be written to the pixel electrode through the capacitor. It will be appreciated in certain embodiments that the capacitor is merely optional and the capacitance of the FET device itself will be sufficient to store the charge for the pixel electrode to thereby maintain the pixel electrode at a certain voltage. Thus the display is updated one row at a time where each row receives in parallel a plurality of data from the parallel columns, such as columns 5, 6, 7 and column 8 as shown in FIG. 1. It will be appreciated that each pixel cell includes a display driver such as display drivers 9, 10, and 11 which control associated pixel electrodes in the display shown in FIG. 1.

While the foregoing display architecture works well generally for many types of applications, it is well known that manufacturing these displays is expensive due to poor yields when the size of the display is large. Further, these displays are by necessity rigid as they are formed on glass and include layers such as polysilicon which are not flexible. Further, the use of polysilicon to create the active backplane of the display means that the electrical characteristics of the display are inferior to single crystal silicon integrated circuits.

SUMMARY OF THE INVENTION

Various different aspects and embodiments of different inventions are described here. These different aspects include types of integrated circuits, assemblies with integrated circuits, display devices and electrical circuits, as well as methods relating to these devices.

According to one aspect of the present invention, a display device includes a plurality of display drivers which includes a serial shift register, wherein the display drivers are located in the display area of the display device which is viewable.

According to another aspect of the invention, an integrated circuit, which has a plurality of functionally symmetric interface pads, includes an instruction decoder which decodes instructions received through at least one of the pads.

According to another aspect of the present invention, an integrated circuit (IC) includes a position detector which detects a position of the IC relative to a receptor substrate and provides a signal which is determined by the position. This IC may be used in an assembly which includes the receptor substrate.

According to yet another aspect of the present invention, an integrated circuit includes a position detector which detects a position of the IC relative to a receptor substrate and also includes a configurable pad which is configurable depending upon the position as one of at least two of the following: an input pad, an output pad, or a no-operation pad.

According to another embodiment and aspect of the present invention, a layout of an integrated circuit has a plurality of functionally symmetric interface pads wherein two such pads are configurable.

According to another aspect of the invention, an assembly includes a receptor substrate and an IC attached to the substrate, and the IC includes a first logic circuit which provides a first function and a second logic circuit which provides a second function, and a selector which selects between the two functions such that the IC performs only the selected function.

In yet another aspect of the present invention, an assembly includes a receptor substrate which includes an opening in the substantially planar region surrounding the opening and further includes a plurality of conductive layers attached over the substantially planar region. An integrated circuit is attached to the opening in the receptor substrate and includes electrical interface pads on a substantially planar surface which is substantially co-planar with the substantially planar region. The IC further includes a first logic circuit coupled to a first set of the electrical interface pads and which provides a first function and also includes a second logic circuit coupled to a second set of the electrical interface pads and which provides a second function which is different than the first function.

An IC according to another aspect of the present invention includes an instruction logic which is coupled to an electrical interface pad, where the instruction logic receives instruction commands to cause the integrated circuit to perform a particular function depending on the received instruction command. The IC further includes a clocked logic circuit which is coupled to the electrical interface pad. The clocked logic circuit receives a clock signal through the electrical interface pad which also provides the instruction commands to the IC.

According to another aspect of the present invention, an exemplary embodiment of a circuit includes an input which receives a signal having first and second edges. The circuit further includes a pulse generation circuit which generates a pulse nested in time between consecutive first and second edges. The circuit also includes a power derivation circuit which is coupled to the input and which is coupled to the pulse generation circuit, where the power derivation circuit generates a voltage value which is used by logic within the circuit.

According to another aspect of the present invention, an exemplary embodiment of a display device includes a two-dimensional array of pixels and an array of display drivers which are coupled to and which control the two-dimensional array of pixels. Each of the display drivers receives a clock signal and a data signal, wherein the clock signal and the data signal are bussed only substantially parallel to one axis of the display.

In yet another aspect of the present invention, an exemplary embodiment of a circuit for shifting a voltage level of a signal includes a first input to receive a clock signal having a pulse during each clock cycle, and a second input to receive a first voltage signal, and a current mirror circuit which is coupled to the first input and which is coupled to the second input. The current mirror controls the state of a node which is coupled to an output driver. The output driver shifts the first voltage signal to a second voltage signal when the node is in a first state.

Other aspects and methods are also described herein.

BRIEF DESCRIPTION OF THE DRAWINGS

The present invention is illustrated by way of example and not limitation in the figures of the accompanying drawings in which like references indicate similar elements.

FIG. 11A shows an exemplary embodiment of a circuit which is used within the IC shown in FIG. 4B.

DETAILED DESCRIPTION

The subject invention will be described with reference to numerous details set forth below and the accompanying drawings which will illustrate the invention. The following description and drawings are illustrative of the invention and are not to be construed as limiting the invention. Numerous specific details are described to provide a thorough understanding of the present invention. However, in certain instances, well-known or conventional details are not described in order to not unnecessarily obscure the present invention in detail. Further, various aspects of the present invention will be described with reference to the use of aspects and embodiments of the invention in display systems. It will be appreciated that the reference to display systems is merely for purposes of illustration and are not to be construed as limiting the invention.

Figure 1:
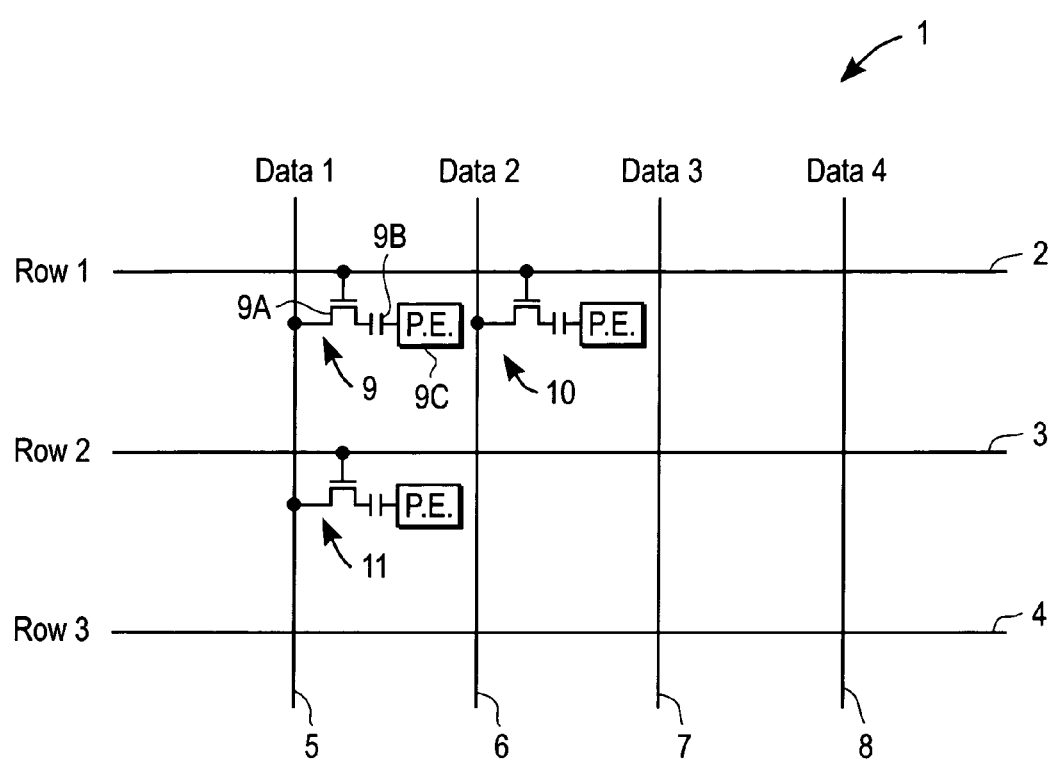
FIG. 1 shows an example of a prior art display.
Figure 2A:
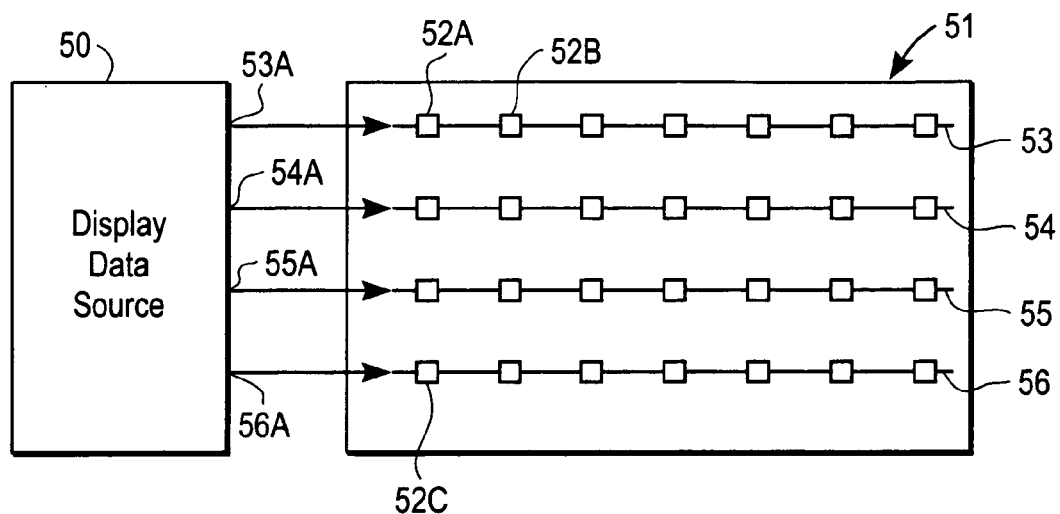
FIG. 2A illustrates an exemplary embodiment of a display according to one aspect of the present invention.

FIG. 2A shows a display system according to one aspect of the present invention. The display system includes a display data source 50 which provides four outputs 53A, 54A, 55A, and 56A which provide data to rows 53, 54, 55, and 56. Output 53A will provide over time a stream of data (typically a serial stream) beginning with data for a last display driver along row 53 at the right end of the row and ending with data for the last display driver along the row 53 on the left side of the row 53, which in this case is display driver 52A. The data is shifted across over time from left to right in order to provide updated display data for the row 53. Each display driver element, such as display driver elements 52A, 52B, and 52C, includes a memory element which is at least one stage of a shift register formed by each row, such as row 53. Further details concerning various different circuits which may be used to provide this shift register formed by several display drivers along a row in the display 51 are provided below. The viewable display area for the display 51 is shown within the rectangular region which has been labeled 51. Thus, the storage elements for the serial shift register along one row are actually within the viewable display area of the display 51 and are on the backplane of the display in this viewable area. As shown in FIG. 2A, each row receives a separate output from the display data source 50. This allows for the display to be updated more rapidly than a display shown in FIG. 2B. It will be appreciated that a row, such as row 53, may in fact be segmented into multiple portions where each portion is a serial shift register that receives an input from an output of the display data source, such as a modified version of the display data source 50. It will also be appreciated that parallel data may be shifted across a row (when more than one data row electrode is used) in certain embodiments.

Figure 2B:
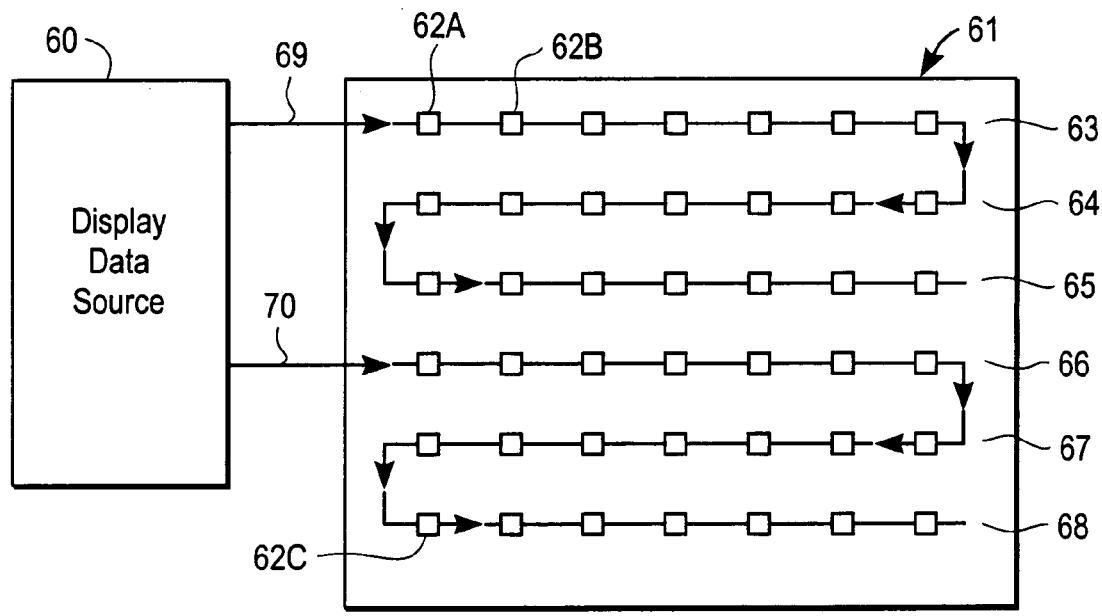
FIG. 2B shows another exemplary embodiment of a display according to an aspect of the present invention.

FIG. 2B illustrates another embodiment according to this aspect of the present invention. In this embodiment, a display data source 60 has two outputs 69 and 70, each of which provides data for three rows of display drivers. These rows are disposed within the viewable area of the display 61. Display data for a new frame of an image to be displayed is shifted from the first display driver in the first row through the serial shift register formed by the three rows to the desired display driver. To update three rows, such as rows 63, 64, and 65, display data for the last display driver on row 65 is first loaded into the display driver 62A and is then clocked or shifted to the next display driver 62B and this is continued until this data reaches the desired display driver at the end (far right side) of row 65. Similarly, data designed to be displayed at other display drivers are shifted through the serial shift register formed by the three rows 63, 64, and 65. A similar operation occurs for rows 66, 67 and 68 which is fed by the output 70. As with the embodiment shown in FIG. 2A, each display driver includes, according to one aspect of the present invention, a memory element within the display driver which is also within the viewable area of the display. The memory element is part of the serial shift register to allow the data to be shifted through the array as shown in FIG. 2B.

Figure 2C:
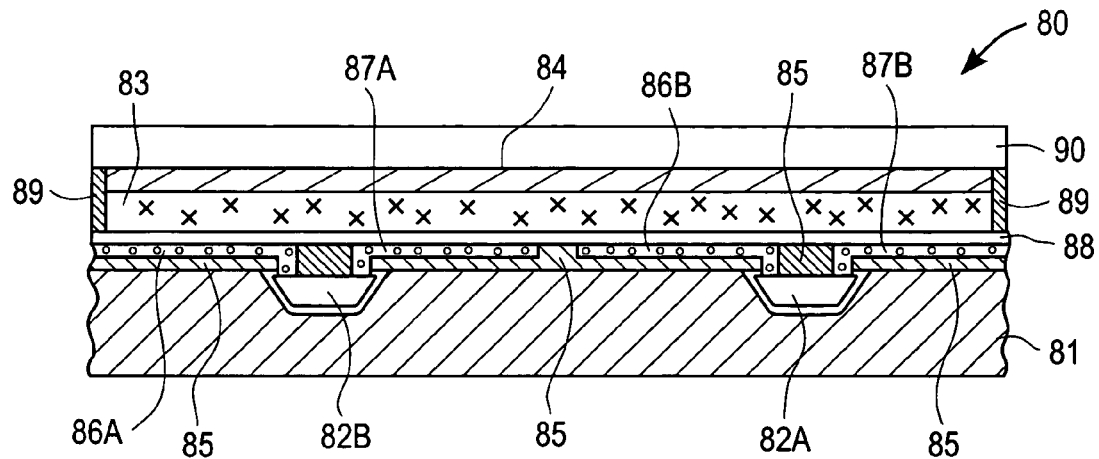
FIG. 2C shows a cross-sectional view of one exemplary embodiment of a display device according to the present invention.

FIG. 2C shows a cross-sectional view of a display according to one embodiment of the present invention. The display system includes a receiving substrate 81 which has receiving openings for integrated circuits 82A and 82B. These integrated circuits are display drivers in one embodiment, such as the display drivers 52A and 52B. FIG. 4B shows one detailed example of a display driver according to one embodiment of the invention. The receiving substrate may be a glass or a foil material or a flexible plastic material. An insulating layer 85 is attached to a top surface of the receptor substrate 81 and openings in the insulator are provided in order to make electrical contact through conductors, such as conductors 86A, 87A, 86B, and 87B. In one embodiment, conductors 87A and 86B may be pixel electrodes and conductors 86A and 87B are electrodes used to provide signals, such as pixel data signals, to their respective integrated circuits 82B and 82A. A layer 88 may be provided on top of the pixel electrodes and the conductive signal electrodes in order to insulate these parts from the display media material 83 which may be a nematic liquid crystal, an electrophoretic display material, a polymer dispersed liquid crystal material, an organic light emitting diode material, a cholesteric liquid crystal material or other known display materials which can be driven by pixel electrodes or other types of display materials which may be controlled by electrodes. A counter electrode or cover glass electrode 84 is typically a thin layer of transparent indium tin oxide which is deposited upon a cover glass 90 which is transparent. Spacers 89 are attached to the layer 88 and to the cover glass 90 to provide a desired spacing between the counter electrode 84 and the layer 88. It can be seen from FIG. 2C that all the necessary interconnections between the integrated circuits which are required to form a backplane for an active matrix display are formed in a single layer which does not require an insulating layer between layers of interconnect conductive material, such as conductive metal layers. Thus the display 80 as shown in FIG. 2C may be fabricated on a flexible substrate in a roll to roll web manufacturing process by applying only a single layer of a conductive material over the receiving substrate 81 and over the integrated circuits deposited into the receiving substrate without a need for a second or further conductive interconnect layers above this single layer of conductive material. This provides for greatly reduced manufacturing costs and improved yield and efficiency in the manufacturing process.

Figure 3A:
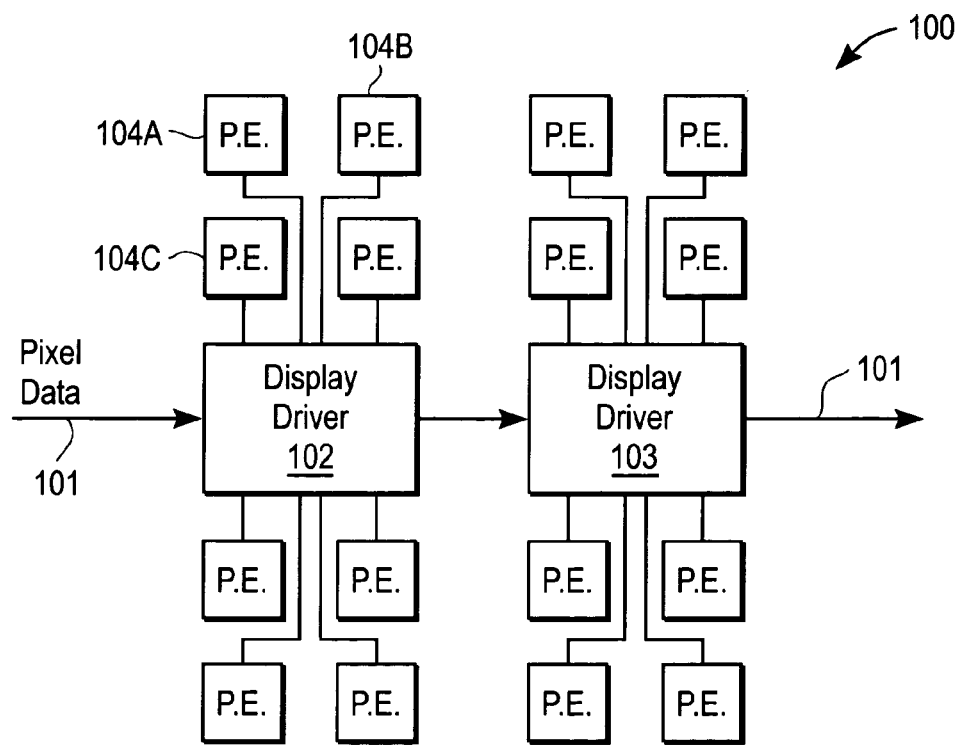
FIG. 3A shows an exemplary embodiment of a display according to one aspect of the present invention.

FIG. 3A shows one exemplary embodiment of a display according to one aspect of the present invention. In this embodiment, the display 100 includes display drivers 102 and 103, each of which control more than one pixel electrode. Furthermore, each display driver in one embodiment acts as a serial storage element in a serial shift register along the row, shifting pixel data along row 101 from one display driver to the next display driver. This shifting may occur under the control of a clock signal which is provided in addition to a data signal. As shown in FIG. 3A, each display driver controls eight pixel electrodes by providing the necessary pixel data (usually as a voltage value) to each pixel electrode in order to locally control the display material to generate a viewable display. The integrated circuit shown in FIG. 4B is an example of a display driver, when that integrated circuit is used as a display driver, which may be used to control eight different pixel electrodes.

Figure 3B:
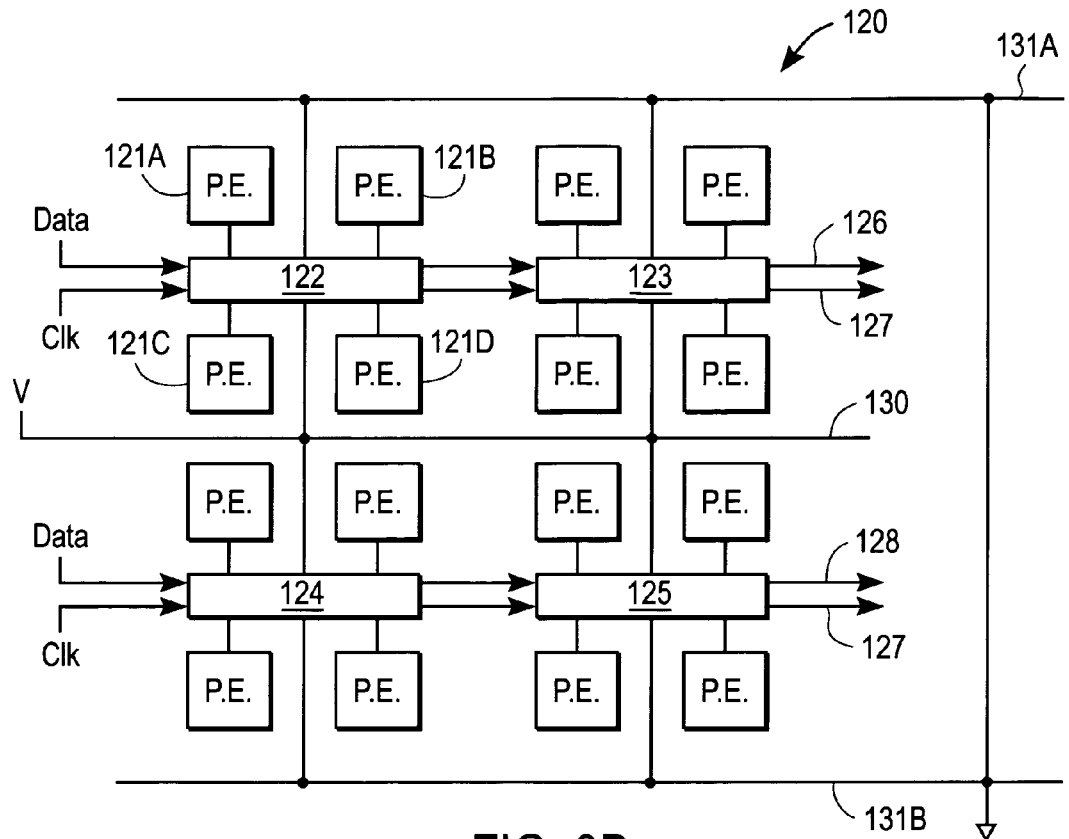
FIG. 3B shows an exemplary embodiment of a display according to another aspect of the present invention.

FIG. 3B shows one example of a display 120 according to one aspect of the present invention. In this display 120, display data and clock data are bussed only substantially parallel to one axis of the display. As shown in FIG. 3B, this axis is the horizontal axis in which the display and clock signals are bussed substantially only parallel to the horizontal axis of the display 120. In this example, each display driver, such as display drivers 122, 123, 124, and 125 control and provide pixel data to four pixel electrodes, such as pixel electrodes 121A, 121B, 121C, and 121D. Display drivers 122 and 123 are along one row and in one embodiment data may be shifted from display driver 122 to display driver 123, where each display driver acts as a serial shift register memory element in a serial shift register formed along the row. Thus data loaded onto the data row 126 is shifted across from left to right along this row which includes display drivers 122 and 123. The shifting of the data through the row is controlled by a clock signal 127. Similarly, on the bottom half of the display, data row 128 provides data signals which are shifted from display driver 124 to display driver 125 under control of the clock signal 127. A voltage power rail source is provided by voltage line 130 and a ground signal is provided by ground lines 131A and 131B. These lines are interconnected to each of the display drivers as shown in FIG. 3B. Note that there is no physical crossover of electrically conductive interconnects, and thus all electrically conductive interconnects required by the display 120 may be formed in a single layer of electrically conductive interconnects, resulting in a structure which is similar to FIG. 2C. An additional group of pixels, arranged as shown in FIG. 3B, may exist above the array of FIG. 3B and another group of pixels, arranged as shown in FIG. 3B, may exist below the array of FIG. 3B. In this manner, a large display having thousands of pixels may be created with the arrangement shown in FIG. 3B.

Figure 3C:
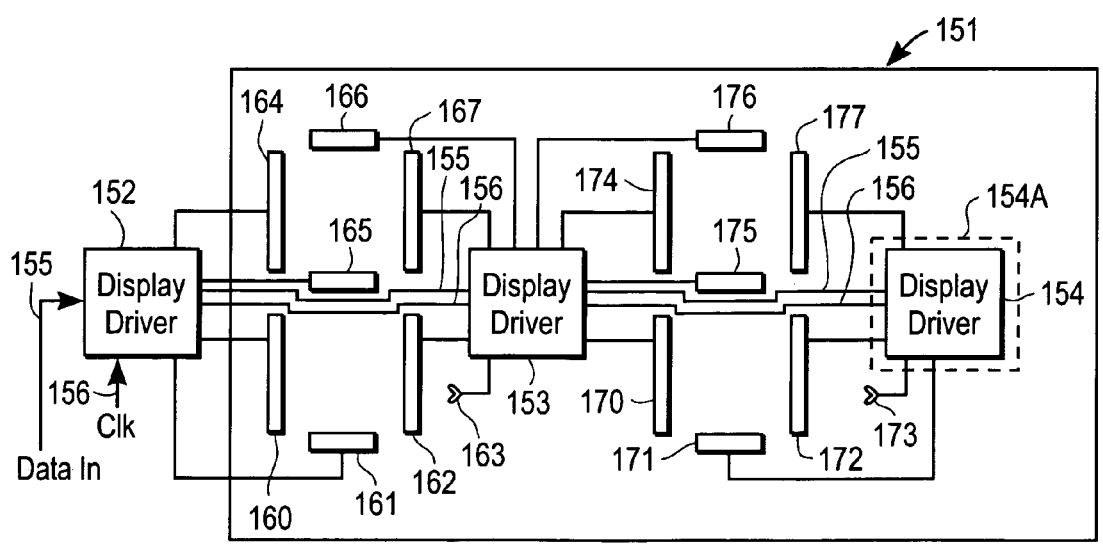
FIG. 3C shows an exemplary embodiment of a display according to yet another aspect of the present invention.

FIG. 3C shows another exemplary embodiment of aspects of the present invention. The display 150 includes a viewable display area 151 which includes within that area display pixels 160–167, and display pixels 170–177 and which further includes display drivers 153 and 154. Also included within the viewable display area are the data line 155 and the clock line 156. As with the example shown in FIG. 3A, the display of FIG. 3C includes display drivers which include memory elements which form a serial shift register. Multiple display drivers in the viewable area of the backplane, each having a storage segment of the shift register, forms a shift register in the display for clocking pixel data through the shift register, in this case from left to right as shown in FIG. 3C. In this case, shown in FIG. 3C, the pixel electrodes are formed in a numeral 8 format in order to display numbers within the viewable display area 151. Display material within the region of each of these pixel electrodes will form a display picture element based upon the control of each individual pixel electrode. It is noted that the display drivers, such as display drivers 153 and 154, are disposed within the viewable area of the display, and at least in one embodiment these display drivers include storage elements for the serial shift register. It will be appreciated that a cover may be placed over each display driver. This optional cover is shown as 154A in the example of FIG. 3C. It will also be appreciated that the display drivers themselves need not be arranged in rows or columns.

Figure 3D:
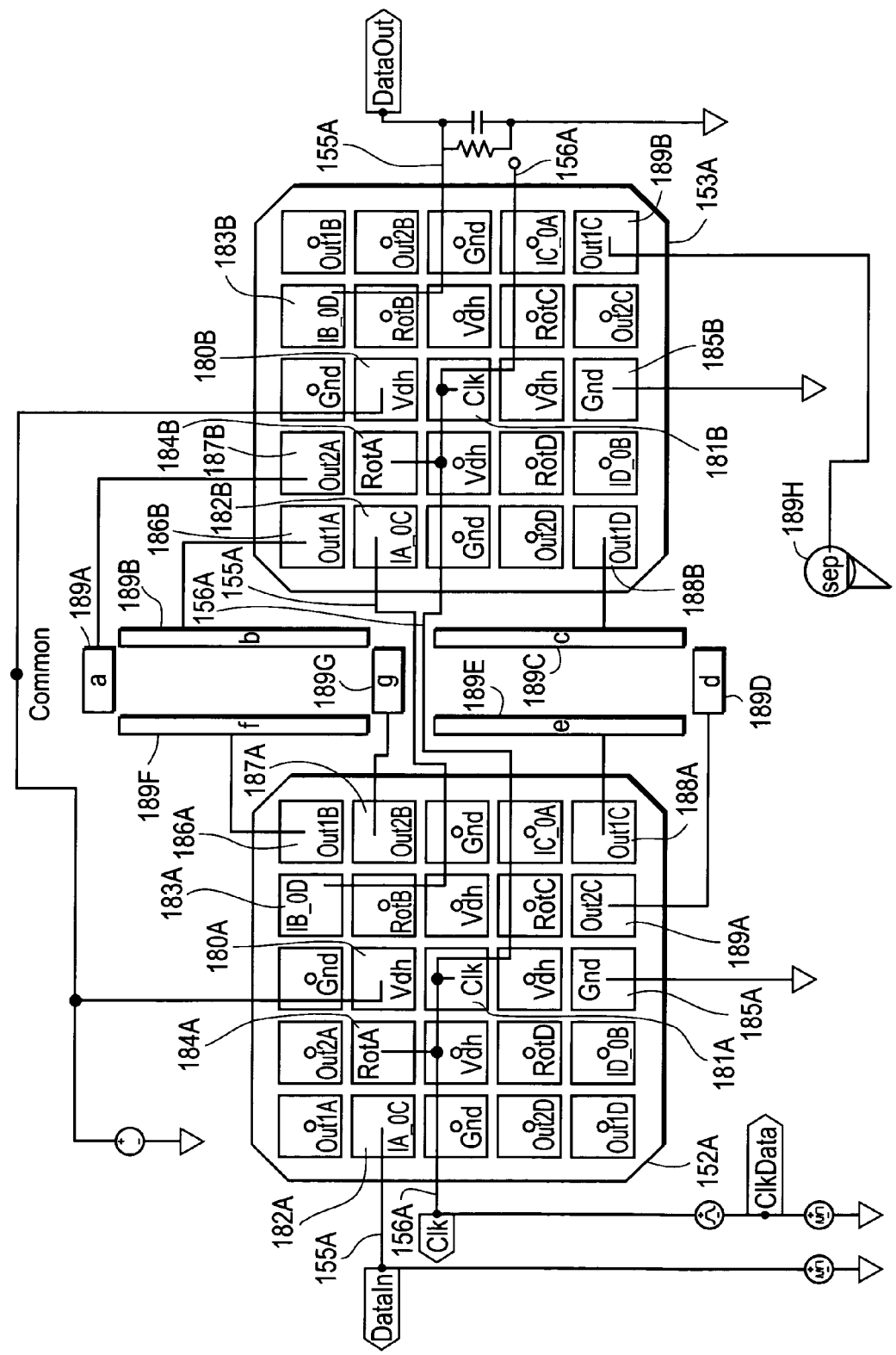
FIG. 3D shows an exemplary embodiment of a display with functionally symmetric integrated circuits which may be deposited into openings in a receptor substrate through a fluidic self-assembly process according to one aspect of the present invention.

FIG. 3D shows an example of a display device which includes two integrated circuits 152A and 153A which together control eight pixel electrodes 189A–189H. In the case of the display device of FIG. 3D, the pixel data is shifted from left to right, that is from the IC 152A to the IC 153A. In particular, the data line 155A inputs data to the input 182A and this data is shifted through output 183A of IC 152A to the input 182B of the IC 153A. If there are further display drivers to the right of IC 153A which require pixel data, then the output pad 183B of IC 153A provides this data along the data signal line 155A. The data is clocked through these ICs under control of the clock signal line 156A which is coupled to the two ICs as shown in FIG. 3D. It can be seen from the layout of FIG. 3D that the metal or other conductive interconnect between the ICs and the pixel electrodes is such that there is no physical crossing of these metal lines in the interconnect layer. Thus referring back to FIG. 2C, a display assembly may be fabricated without requiring a multilevel metal interconnect where each layer allows for a physical crossover because there is an insulating layer between a first metal layer and a second metal layer. The interconnection of an interconnect to an integrated circuit is shown by the absence of a circle within the pad shown in FIG. 3D. Thus, for example, pad 180A and 185A do not have circles, indicating that pad 180A receives the Vdh signal while pad 185A receives the ground (Gnd) signal. It can be seen that the rotate A (ROTA) pad 184A receives the clock signal which is also received by the clock pad 181A. Four output pads 186A, 187A, 188A, and 189A drive four pixel electrodes from the integrated circuit 152A as shown in FIG. 3D.

It will be appreciated that the display device of FIG. 3D may be fabricated using conventional techniques wherein the integrated circuits 152A and 153A are disposed on a printed circuit board and separately drive pixel electrodes through the interconnections shown in FIG. 3D. However, in one particular embodiment of the present invention, the integrated circuits 152A and 153A may be fabricated in a single crystal semiconductor (e.g. silicon) wafer and then separated from the wafer and placed into a slurry. Then the slurry may be deposited over a receptor substrate which has openings in the substrate which have been designed to receive the separated integrated circuits in the slurry. An example of a resulting structure is shown in FIG. 2C. The slurry is deposited over the receiving substrate in a fluid and the integrated circuits self-assemble into the openings through a process referred to as fluidic self-assembly. Fluidic self-assembly is known in the art; see, for example, U.S. Pat. No. 5,545,291. Methods for forming the separated integrated circuits are also described in co-pending U.S. patent application Ser. No. 09/433,605, which was filed on Nov. 2, 1999, which U.S. patent application is hereby incorporated herein by reference. It will be appreciated that the use of fluidic self-assembly will typically cause symmetrically shaped integrated circuits (e.g. a square) to be deposited into the openings in many orientations. That is, the orientation of the IC cannot be controlled in the process. Thus, at least in many instances, the electrical interface pads such as the pads shown by the squares within the ICs 152A and 153A must be functionally symmetric from an external interface point of view. That is, for example, the pad in the upper left corner of each IC after it is deposited into the opening should be an output pad such as the output pad 186B. It can be seen from FIG. 3D that the rotational orientation of IC 152A has four possible states such that, in one state, pad Out1A is in the upper left corner of the IC as it sits in an opening in a receptor substrate while in a second rotational state, pad Out1D is in the upper left corner, and in a third rotational state, pad Out1C is in the upper left corner, etc. Thus it can be seen that the rotational orientation may be one of four orientations relative to a receptor substrate in the case of the display device shown in FIG. 3D. This will require that the integrated circuit be externally functionally symmetric even though internally its circuitry may be asymmetric. The following description will provide a detailed example of several embodiments which provide this functionality. In one case, the integrated circuit includes a position detector for determining its position which may be either a translational position relative to the receptor substrate or a rotational orientation of the integrated circuit relative to the opening in the receptor substrate. Further, in certain embodiments, interface pads on the integrated circuit are configurable to provide different functions based upon the position of the integrated circuit. Further, in certain embodiments, the integrated circuit can provide different functions depending upon its position and these different functions may be provided selectively such that only one function is provided or concurrently in certain instances.

The following description, for purposes of illustration, focuses upon the use of these integrated circuits for display devices. It will be appreciated, however, that these integrated circuits may be used in other types of systems including antenna arrays or detector systems or sensor systems or to provide multiple functions concurrently such as a display and touch screen system where each integrated circuit functions as a display driver as well as providing the circuitry necessary for the functionality of a touch screen sensor. It will also be appreciated that when the integrated circuits of the present invention are used in display devices, for example, as display drivers, that various different types of displays may be created. For example, the display may be a reflective monochrome or color active matrix display, or it may be a transmissive active matrix display such as those found on modern laptop computers (e.g. such as the Macintosh PowerBook G3 laptop from Apple Computer), or it may be an emissive display device (e.g. such as an OLED display). The display may require refreshing or may be bistable (which retains its display state without refreshing).

Figure 4A:
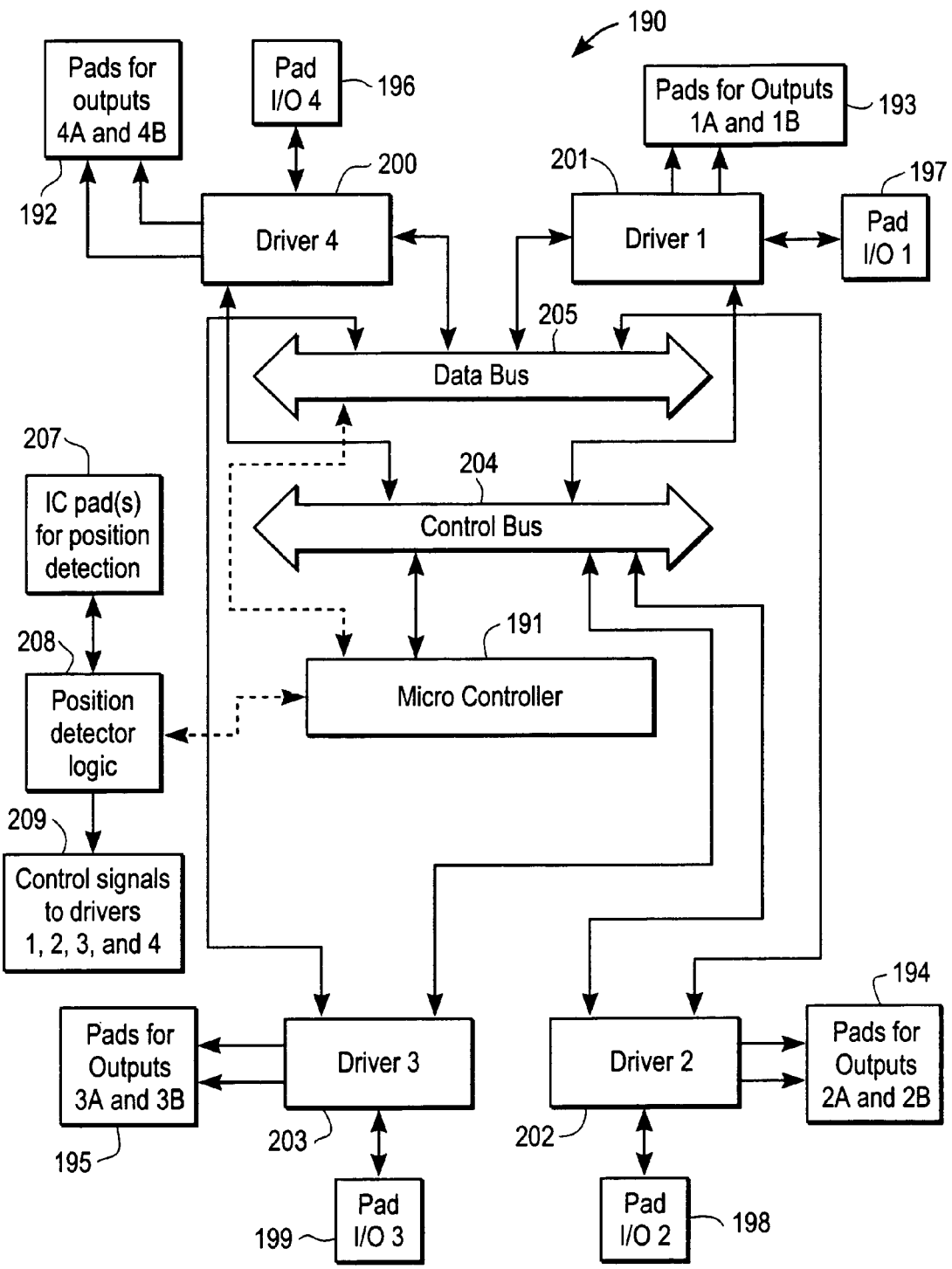
FIG. 4A shows an exemplary embodiment of an IC which includes a position detector according to one aspect of the present invention.
Figure 4B:
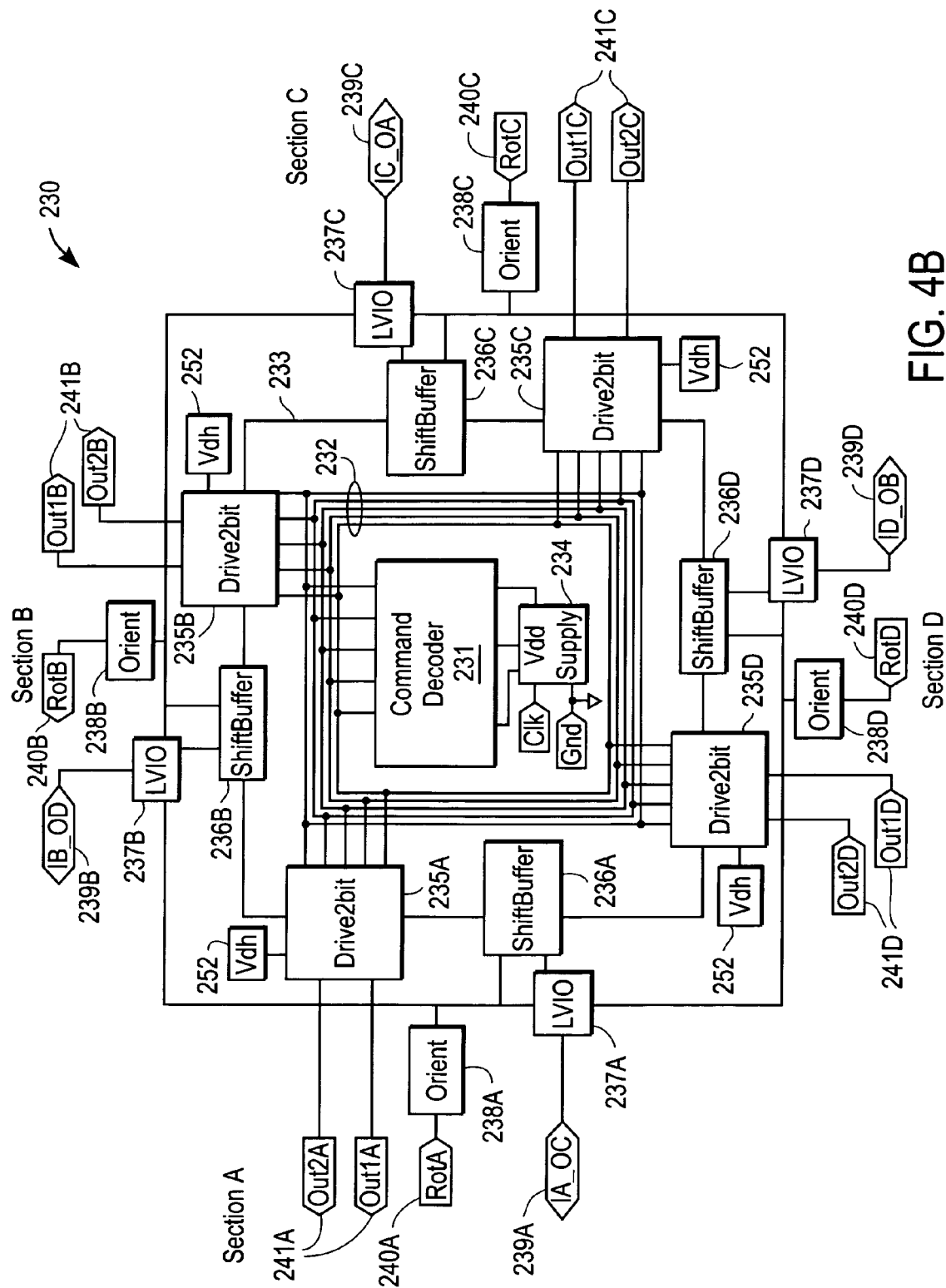
FIG. 4B shows another exemplary embodiment of an IC which includes a position detector according to one aspect of the present invention.

FIG. 4A shows an example of an integrated circuit 190 according to one embodiment of the present invention. This circuit 190 may be used to create the integrated circuit 152A or 153A shown in FIG. 3D. It may be fabricated such that internally it is asymmetric but externally its electrical interface pads are arranged so that they are externally functionally symmetric such as the integrated circuit 152 shown in FIG. 3D. However, according to other aspects of the invention, an embodiment of the circuit 190 does not need to be functionally symmetric externally. The circuit 190 includes the microcontroller 191 which is optionally coupled to a position detector logic 208. The microcontroller 191 is also coupled to a control bus 204 and may optionally be coupled to a data bus 205. Four drivers 200, 201, 202 and 203 are coupled to the data bus 205 and are also coupled to the control bus 204. Each driver is coupled to its respective I/O (input/output) pad on the integrated circuit and they are also coupled to their respective pads for outputs as shown in FIG. 4A. For example, driver 200 is coupled to pad I/O4 labeled as pad 196. It will be appreciated that this is an external electrical interface pad on the integrated circuit. The driver 200 is also coupled to the pads 192 which in this case are two output pads 4A and 4B. An example of such pads are shown in FIG. 3D, such as pads 186A and 187A. An example of pad 196 is pad 183A shown in FIG. 3D. Pad 196 is in one embodiment a configurable pad which is configurable to be either an input pad or an output pad or a no-operation pad depending upon control signals provided to driver 200. In one embodiment, these control signals may come from the control bus 204. In another embodiment, the control signals may come from the control signal logic 209 which is coupled to each of the drivers 200, 201, 202, and 203. Control signal logic 209 receives signals from the position detector logic 208 which indicates the position of the integrated circuit 190 on a receiving substrate. This position is determined by an electrical signal received by the IC pad or pads 207. The rotate A pad 184A is an example of such a pad 207 (see FIG. 3D for the rotate A pad 184A).

Integrated circuit 190 may be fabricated into a single block of a semiconductor substrate and then separated from the substrate and floated into an opening on a receptor substrate to create the structure shown in FIG. 2C (e.g. floated by a fluidic self-assembly process) or it may be part of a larger conventional integrated circuit which is wire-bonded to a carrier or chip package and attached to a printed circuit board. However, for the following embodiments which will be described, it will be assumed that the integrated circuit 190 is contained within a block of a semiconductor which is separated from a semiconductor substrate and then deposited into receptor sites in a receptor substrate through a fluidic self-assembly process (e.g. to achieve a structure similar to the structure shown in FIG. 7C). The integrated circuit 190 will be deposited onto a receptor site, such as an opening in a receptor substrate (e.g. see FIG. 2C). The exact position and orientation of the integrated circuit 190 cannot be controlled in this process. Accordingly, it is required to determine the position of the integrated circuit 190 relative to the receptor substrate. This requirement may be necessary to determine a translational position on the substrate (e.g. is the integrated circuit within a two-dimensional region or outside of a two-dimensional region on the receptor substrate) or the rotational orientation of the integrated circuit on a receptor site on the substrate (e.g. is the pad Out1A shown in FIG. 3D in the upper left corner or the upper right corner or the lower right corner or the lower left corner of the opening on the receptor substrate relative to the position of interconnect lines on the receptor substrate). In one embodiment of the present invention, the translational position of the integrated circuit is not detected but the rotational orientation is detected. In alternative embodiments, however, both may be detected or merely the translational location may be detected as described below. The position detector 208 receives signals from the pad or pads 207 and these signals are decoded to provide a position signal which may then be provided to the drivers 200, 201, 202, and 203 through the control signal logic 209. Alternatively, the position detector logic may provide a signal directly to the microcontroller 191 which can then provide signals to a control bus 204 to specify the desired functionality based on the position to each of the drivers 200, 201, 202, and 203. In one particular embodiment (e.g. see FIG. 4B) the control signal logic 209 provides the signals specifying the position directly to the drivers 200, 201, 202, and 203. These drivers, after the position has been determined by the position detector logic 208, then provide appropriate control signals so that the configurable pads, such as pads 196, 197, 198, and 199 can be appropriately configured for the detected position. For example, in one embodiment, driver 200 may configure pad 196 as an input pad and driver 202 may configure pad 198 as an output pad allowing data to be, for example, shifted into pad 196 through driver 200 and then to the data bus 205 and then to the driver 202 for outputting of the data through the pad 198. In this case, this would provide for the functionality shown in FIG. 3A in which the pixel data is shifted from left to right from display driver to display driver. At the same time the control signals to drivers 201 and 203 would cause the pads 197 and 199 to be configured to be no-operation pads. The signals coming into pad 196 would be supplied by the driver 200 directly to pads 192 (for data intended for those pads) or to the data bus 205 which is used to distribute the data to the other drivers. While a parallel data bus 205 is shown in FIG. 4A, it will be appreciated that a serial data bus, such as that shown in FIG. 4B, may also be utilized as an alternative embodiment. The microcontroller 191 may optionally be coupled to the data bus to receive data and to store it internally within the microcontroller (e.g. within a register in the microcontroller) which then can be used to put the data back on the bus and control the control bus 204 to cause another driver to receive its data under control of the microcontroller 191. A specific example of a microcontroller 191 is provided below (e.g. see command decoder 231 in FIG. 4B which is described below). An example of a control bus is also described below (see control bus 232 shown in FIG. 4B and described below).

It will be appreciated that the integrated circuit 190, when fabricated in a block of a semiconductor substrate which is then separated from the substrate and deposited through a fluidic self-assembly process onto a receptor substrate, is a case of a rotationally symmetric microcontroller or microprocessor. That is, the integrated circuit 190 includes a microcontroller or microprocessor in an integrated circuit which is externally functionally symmetric. The microcontroller or microprocessor may include many of the conventional components of a microcontroller or a microprocessor such as instruction decoders, instruction registers, data registers, ALU (arithmetic logic units), etc. Further, the functionality of this integrated circuit may be determined by the position detector logic 208 such that in one embodiment the integrated circuit provides one functionality in one position and another functionality in another position. Further, in yet another embodiment, the configurable pads may be configured to provide different signals or functions depending upon the position of the integrated circuit relative to the receptor substrate.

FIG. 4B shows an exemplary embodiment of an integrated circuit 230 which may be used in a display device such as the display device 80 shown in FIG. 2C. In particular, the integrated circuit 230 may be used as the ICs 82B and 82A as shown in FIG. 2C. The integrated circuit 230 includes a command decoder 231 and a control bus 232. It also includes a serial data bus 233 which is used to shift data among the drivers 235A, 235B, 235C and 235D. The command decoder 231 is coupled to a voltage supply circuit 234 which generates an internal voltage rail supply voltage as described below based upon a signal, which in this case is a clock signal. The integrated signal 230 also includes shift buffers 236A, 236B, 236C, and 236D which are coupled to the serial data bus 233 as shown in FIG. 4B. Each shift buffer, such as shift buffer 236A, is coupled to an I/O controller such as I/O controller 237A which in turn is coupled to an electrical interface pad such as interface pad 239A. The integrated circuit 230 includes four I/O controllers 237A, 237B, 237C, and 237D. Each of these I/O controllers is coupled to its respective I/O pad, such as pads 239A, 239B, 239C and 239D. These I/O pads are configurable input/output pads. In one embodiment, these pads are configured to provide the desired functionality based upon the position of the integrated circuit 230 relative to a receptor substrate. For example, one of these I/O pads may be turned into an input pad while another of these I/O pads may be turned into an output pad and the other two I/O pads may be turned into no-operation pads.

The functionality of the pads will be specified in one embodiment by the position detector which in this case includes four orient circuits 238A, 238B, 238C, and 238D. As can be seen from FIG. 4B, orient circuit 238A is coupled to the input enable input of the I/O controller 237A and to the output enable input of the I/O controller 237B. An input to the orient circuit 238A is coupled to the position detector pad 240A which corresponds to the rotate A pad 184A shown in FIG. 3D. The orient circuit 238B has an output coupled to the input enable input of the I/O controller 237B and also coupled to the output enable input of I/O controller 237C as shown in FIG. 4B. An input to the orient circuit 238B is coupled to the position detector pad 240B which corresponds to the pad ROTB shown in FIG. 3D. The orient circuit 238C has an output coupled to the input enable input of the I/O controller 237C and to the output enable input of the I/O controller 237D. An input to the orient circuit 238C is coupled to the position detector pad 240C which corresponds to ROTC pad shown on the integrated circuits of FIG. 3D. The orient circuit 238D has an output coupled to the input enable input of the I/O controller 237D and also to the output enable input of the I/O controller 237A. An input of the orient circuit 238D is coupled to the position detector pad 240D which corresponds to the pad ROTD pad on the integrated circuit shown in FIG. 3D. While further extensive, detailed description of the structure and operation of the integrated circuit 230 will be provided below, a brief introductory description will be provided here.

The integrated circuit 230 provides the capability of driving up to eight segments or pixel electrodes with four output driving circuits 235A, 235B, 235C, and 235D. The command decoder 231 contains the command shift register for clocking in a series of four possible commands and decoding these commands which are then provided through the control bus 232 to the drivers 235A, 235B, 235C, and 235D. These commands or instructions are latched into an execution register to provide continuous command update capability. The eight high voltage outputs are derived from four two-bit blocks to provide four-sided symmetry. These high voltage outputs are latched separately to provide independent display updating, and to provide the capability to reset and invert the final output. The digital power supply uses the clock input as its source which provides fewer input requirements, and greater improved efficiency over generation from the high voltage supply 252 (Vdh). The orient circuits determine the data input and output to the entire integrated circuit 230 depending on which direction the integrated circuit settles into a receiving substrate in the fluidic self-assembly process. If, for example, the integrated circuit 230 settles into the receiving substrate such that the rotate A pad 240A receives a clock signal (see, for example, FIG. 3D) then shift buffer 236A will cause an effective disconnect in the data bus 233 between the data out port of the driver circuit 235D and the data in port of the driver circuit 235A. Further, pad 239A will become an input pad and pad 239B will become an output pad and pixel data or other data will get shifted into input pad 239A through the I/O controller 237A and through the shift buffer 236A and then through the circuits 235A, 236B, 235B, 236C, 235C, 236D and then to the I/O controller 237D and finally to the output pad 239D. This will allow the display driver, when the IC 230 is used as a display driver, to shift data from one display driver to another display driver, such as the embodiment shown in FIG. 3D. As will be described further below, each driver circuit, such as driver circuit 235A, will receive after all data has been shifted through the appropriate display data which then can be used to update to the outputs which are coupled to the driver, such as outputs 241A or 241B, etc. As described in one embodiment below, the command decoder 231 receives the various commands used to control the integrated circuit through the clock signal 279, which in one embodiment is also providing, as noted herein, a power voltage rail for the operation of other logic within the integrated circuit 230.

Figure 4C:
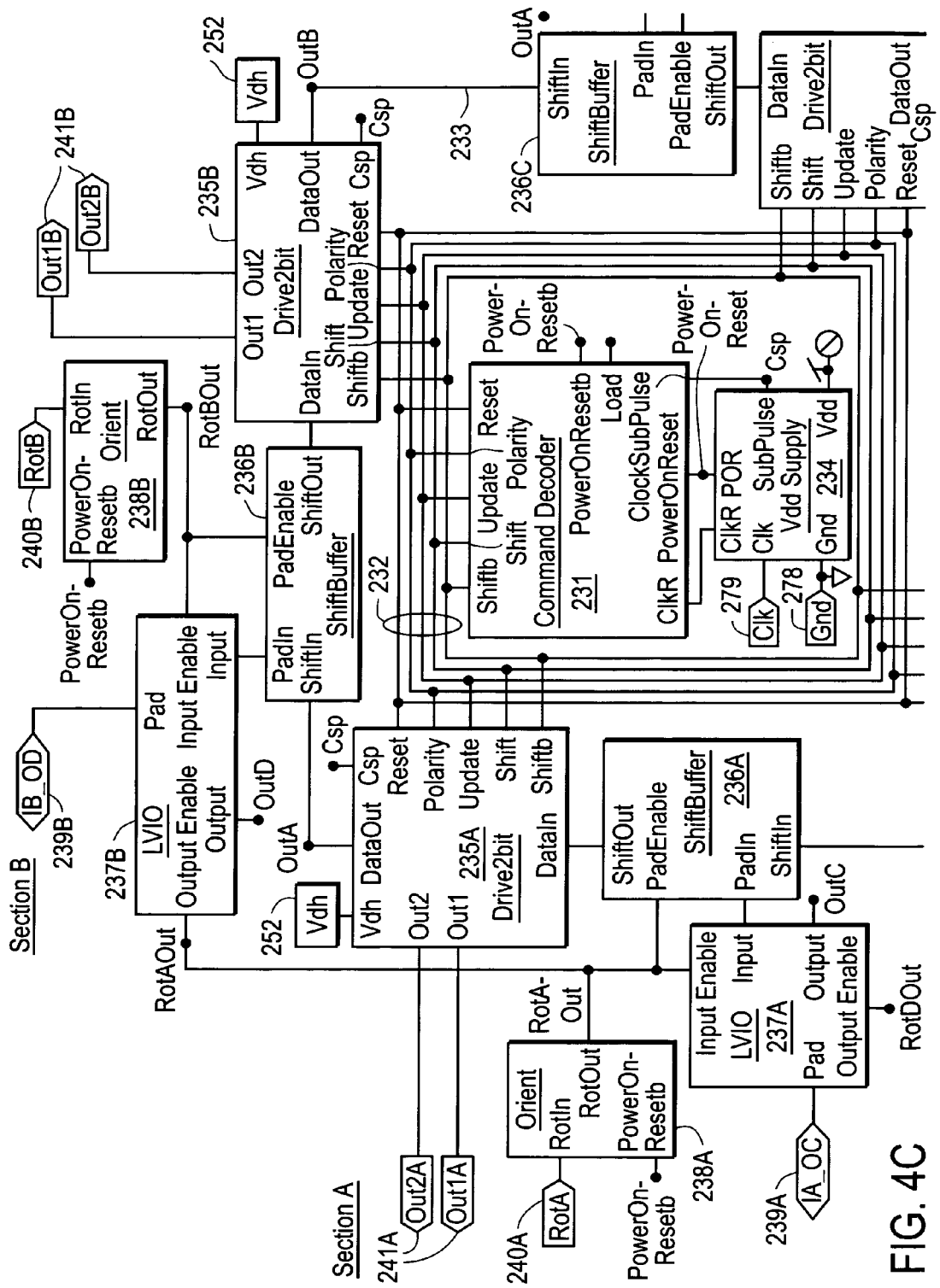
FIG. 4C shows an enlarged view of a substantial portion of FIG. 4B.

FIG. 4C is an enlarged version of FIG. 4B showing much of the circuit shown in FIG. 4B. It will be appreciated that since the integrated circuit 230 in one embodiment is externally functionally symmetric, the portion shown in FIG. 4C shows enough of a view of FIG. 4B such that there is an adequate description of this circuit. Table A shows a description of each of the pads of IC 230.

TABLE A

Pin/Pad Description

| Pin | Type | Description |
| --- | --- | --- |
| Clk | Input | Clock for data and command input, and digital power supply |
| Vdh (X4) | Power | High voltage power supply |
| Gnd (X4) | Ground | Analog and digital ground |
| IA/OC | Inout | Four input/output data pins. One configured as input, and one as output by orientation pins. (all LVIO pins have internal pull down resistors.) |
| IB/OD | | |
| IC/OA | | |
| ID/OB | | |
| RotA | Input | Rotational orientation control signals. Assertion of one signal will select data input and output pins |
| RotB | | |
| RotC | | |
| RotD | | |
| Out1A | Output | High voltage outputs |
| Out2A | | |
| Out1B | | |
| Out2B | | |
| Out1C | | |
| Out2C | | |
| Out1D | | |
| Out2D | | |

Figure 5A:
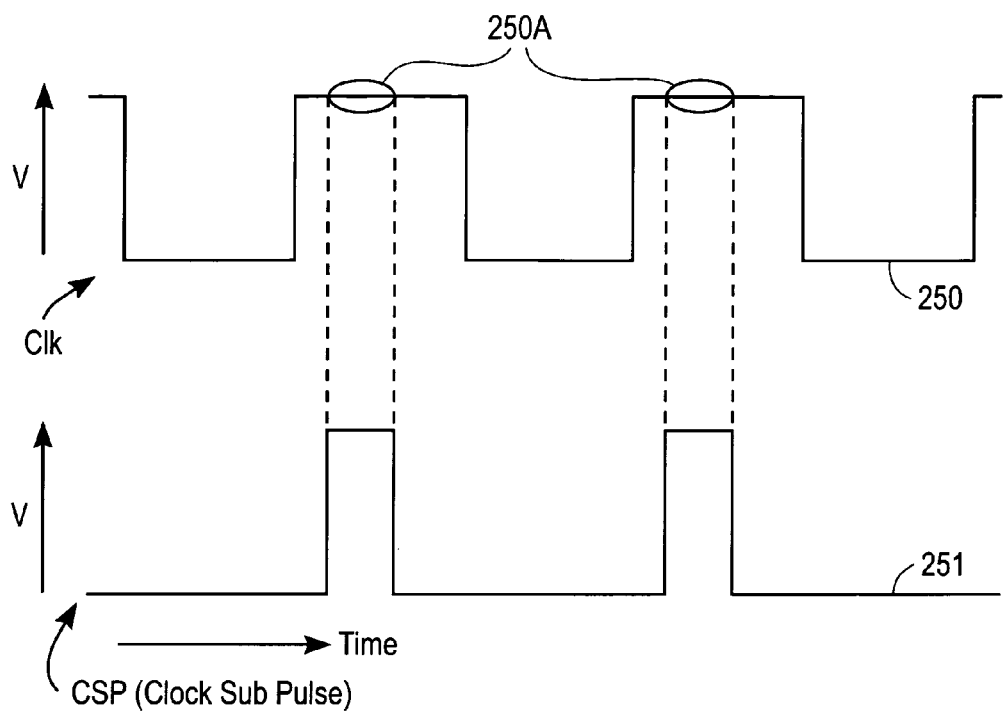
FIG. 5A shows the relationship in time between two clock waveforms.
Figure 5B:
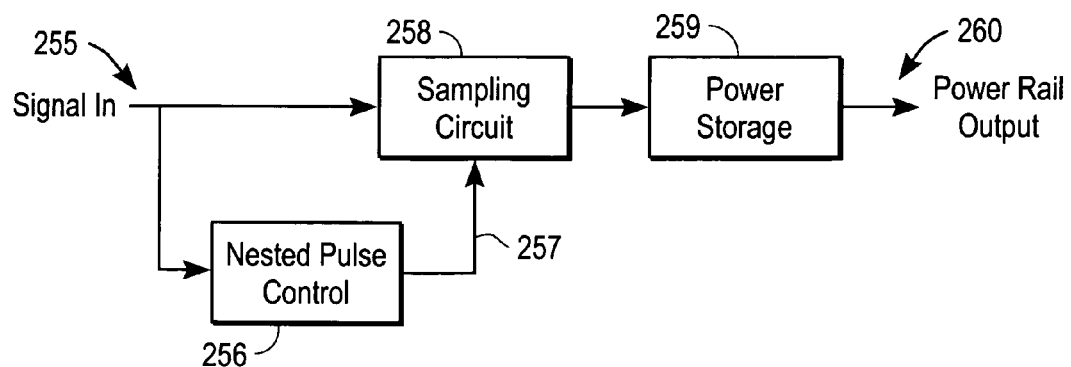
FIG. 5B shows one exemplary embodiment of a circuit according to one aspect of the present invention.
Figure 5C:
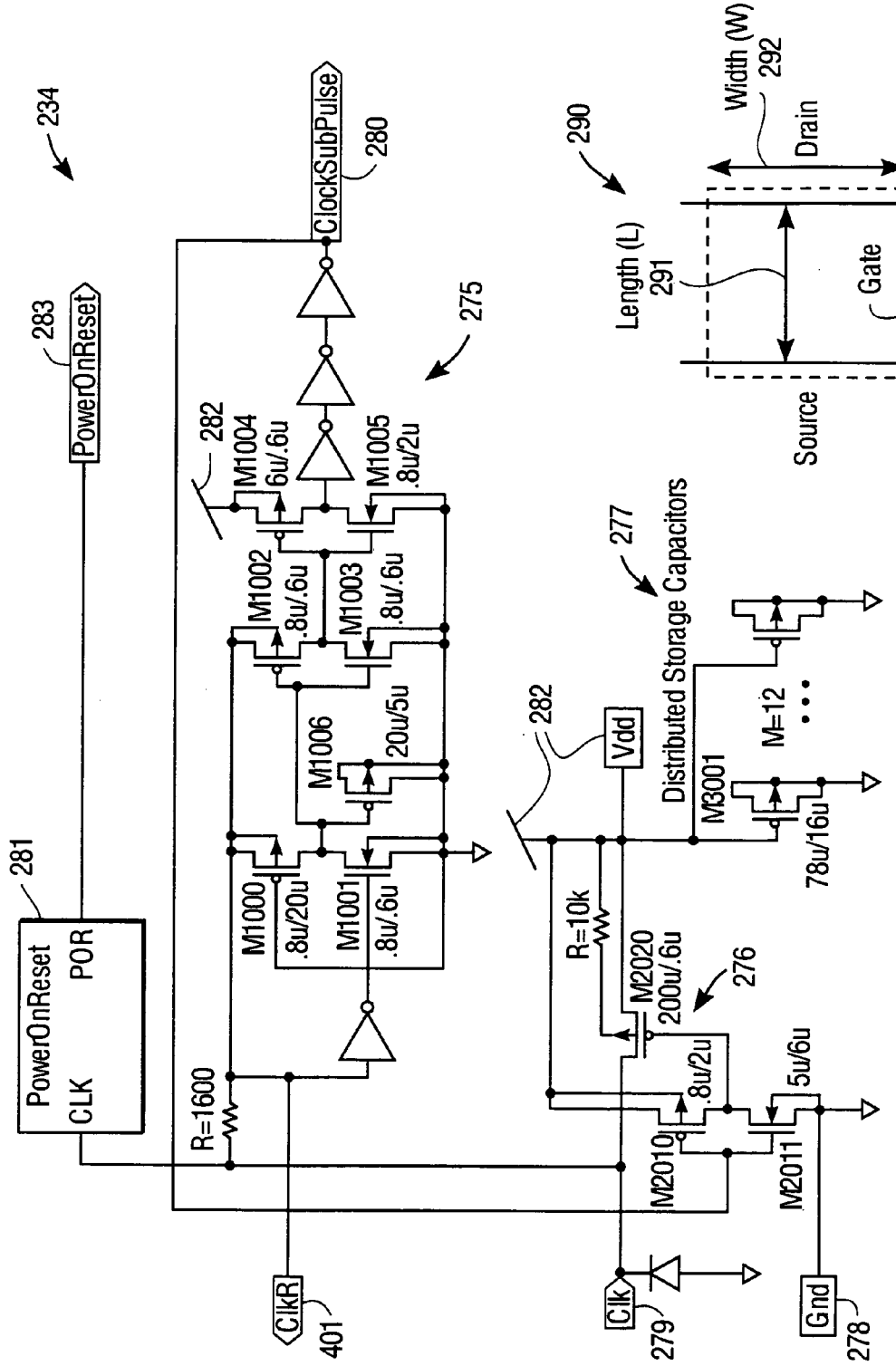
FIG. 5C shows another exemplary embodiment of a circuit according to an aspect of the present invention.
Figure 5D:
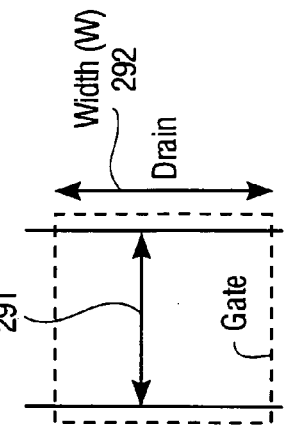
FIG. 5D shows a top view of an insulated gate field effect transistor in order to specify the width-length ratio measurements given throughout this description for field effect transistors.

One aspect of the integrated circuit 230 will now be described by referring to FIGS. 5A, 5B, and 5C. This aspect relates to a circuit in which a power voltage rail signal is derived from another signal which in one embodiment is a clock signal. This power voltage rail signal is then used by other logic within the integrated circuit to derive power for the other logic. As shown in FIG. 5A, the signal 250 may be a clock signal which has a regular duty phase which in this case is a 50% duty cycle. The signal 251 has a pulse nested within consecutive rising and falling edges of the clock signal 250 shown in FIG. 5A. That is, the pulse signal 251 rises only after the clock signal has settled in a high state and falls while the clock signal 250 is still within a high state. This signal 251 may be generated by a nested pulse control logic 256 from the signal 250. The nested pulse control logic 256 generates at an output 257 the signal 251 which is supplied to a sampling circuit 258 as shown in FIG. 5B. The sampling circuit 258 also receives the input signal 255 which may be the clock signal 250. The sampling circuit 258 generates a power supply signal which is stored in a power storage 259 which is then used to provide a power voltage rail output 260. FIG. 5C shows one exemplary embodiment of the circuit shown in FIG. 5B. The clock input 279 is supplied to a nested pulse control circuit 275 which provides an output labeled clock subpulse 280 which is the same as the signal 251 shown in FIG. 5A. This output 280 controls a sampling circuit 276 which includes the transistor M2020 as shown in FIG. 5C. The signal 280 is supplied to the transistor M2020, which is a P channel transistor, through the inverters formed by transistors M2010 and M2011. The N channel device of this inverter, transistor M2011, is coupled to ground 278. The power storage is formed by the storage capacitors 277 which in one embodiment are twelve large field effect transistors wired as capacitors as shown in FIG. 5C. The voltage sampled from the high clock signal during the pulse is stored in these storage capacitors in order to provide the voltage Vdd which is labeled as 282. Thus, when the clock signal rises high, after a short period of time the transistor M2020 allows the high clock signal to be stored onto the storage capacitors 277 and then after the pulse signal 251 falls back to a low state, the clock signal 279 is disconnected from the storage capacitors. This sequence is repeated for each clock cycle such that charge from the clock high signal during a portion of the time that the clock is high is stored onto the storage capacitors 277 during the portion of the time that the pulse signal 251 is high, which only occurs during a portion of the time 250A as shown in FIG. 5A when the clock signal is high. FIG. 5C also shows that the clock signal 279 is used to generate other signals including a clock R (ClkR) signal 401 (through a resistor). The circuit 234 shown in FIG. 5C includes various transistors which are either P channel FETs or N channel FETs. The width/length ratio for these transistors are shown in FIG. 5C. FIG. 5D shows the length 291 relative to the width 292 for an FET device having a gate, source and drain, where the gate of the FET 290 is shown by a dashed line as slightly overlapping the source and drain regions of the FET 290. It will be appreciated that other ratios may be utilized depending upon the desired characteristics of the circuit.

Figure 6:
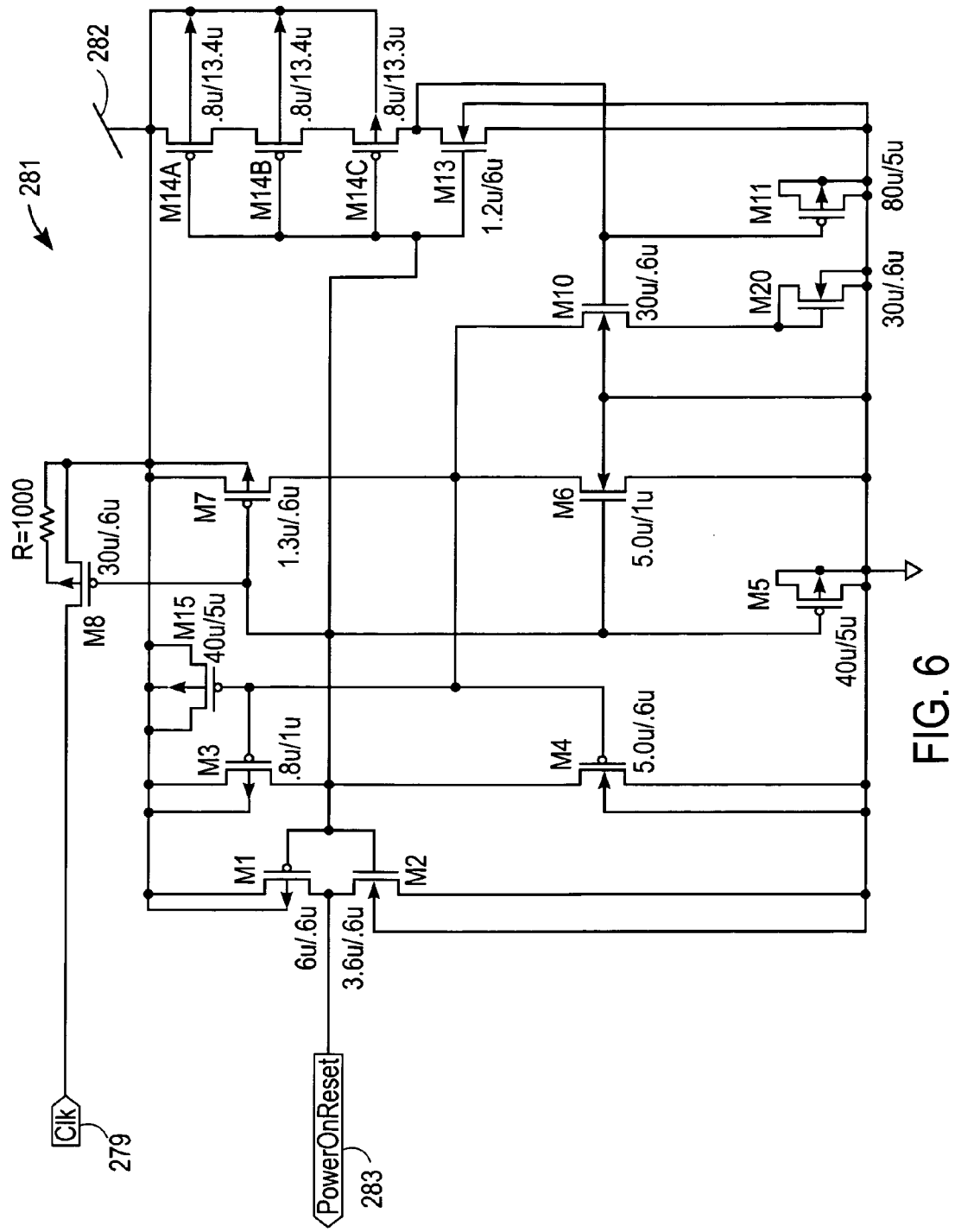
FIG. 6 shows an exemplary embodiment of a circuit used within the IC shown in FIG. 4B.

FIG. 6 shows the power on reset circuit 281 which receives the voltage rail input 282 (Vdd) and the clock signal 279 input and provides a power on reset output 283 through the circuitry shown in FIG. 6. This circuit generates a short pulse (a high pulse) for a few microseconds if the clock signal comes up quickly and thereafter the power on reset signal 283 goes low and remains low. If the clock signal comes up slowly (rises slowly) the power on reset signal will go high for a few microseconds after Vdd has retained its normal operating value (e.g. 5 volts). The power on reset circuit of FIG. 6 consists of a simple latch which is sized and capacitor coupled to force a consistent start up orientation. Upon application of the first rising edge of the clock signal, this circuit will assert until its own internal timing triggers the latch to flip, and this will deassert (drive low) the output signal 283. The internal timing of the output signal 283 varies with the Vdd voltage levels, but provides a consistent pulse for resetting internal circuit nodes which receive the output signal 283.

Figure 7A:
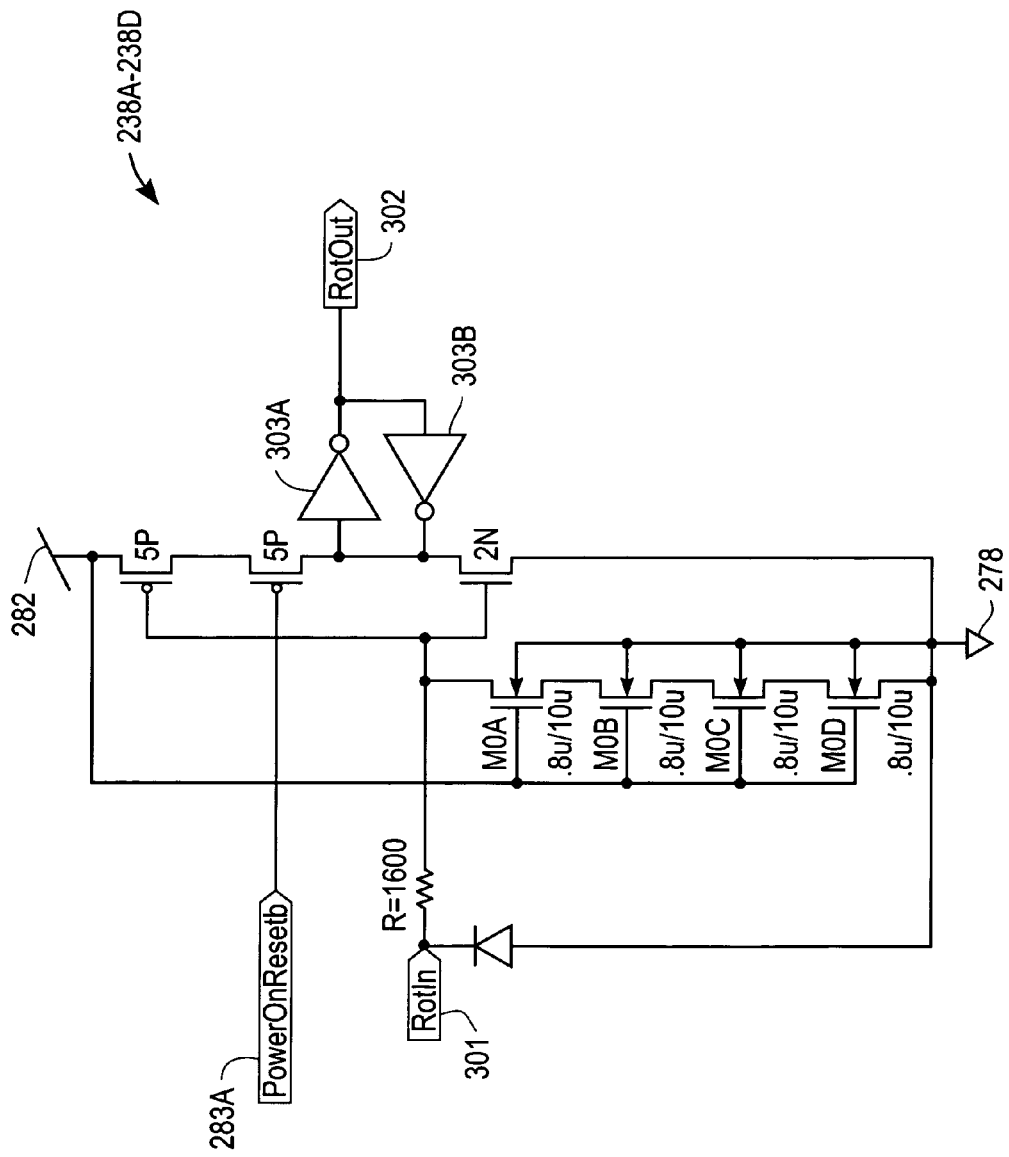
FIG. 7A shows an exemplary embodiment of a circuit which is used within the IC shown in FIG. 4B.

FIG. 7A shows an example of a position detector circuit which in this case is the orient circuit such as orient circuit 238A or 238B or 238C or 238D. The orient circuit shown in FIG. 7A receives the Vdd input 282 and ground 278 and also a rotate in (ROTIN) input signal 301. The rotate in signal 301 is coupled to the corresponding rotate or position detect pad such as pad 240A for the corresponding orient circuit as shown in FIG. 4B. The rotate out or ROTOUT signal 302 provides the output from the orient circuit which is coupled to two I/O controllers as shown in FIG. 4B for the corresponding orient circuit. For example, if the orient circuit is orient circuit 238A, then the rotate out signal 302 is coupled to the input enable input of the I/O controller 237A and to the output enable input of the I/O controller 237B. And in this instance, the rotate in input 301 is coupled to the rotate A pad 240A. The inverse of the power on reset signal is received as the input 283A and is coupled to a P channel device as shown in FIG. 7A. A latch formed by inverters 303A and 303B stores a state which provides the output signal to the output 302. When the integrated circuit 230 is first powered up, all orient circuits provide a low or zero output, and then the one orient circuit which is coupled to the position detector pad which is coupled to receive the clock signal (see, for example, the rotate A pad 184A shown in FIG. 3D) provides a high signal at the output 302 while the other orient circuits continue to provide a low signal at the output 302 of their circuits. In this manner, all four orient circuits shown in FIG. 4B cooperate together to provide a position detector which specifies the internal functionality of the integrated circuit 230 depending upon the position detected by the position detector circuits. It can be seen that the orient circuit is disabled during a power up operation but subsequently one is enabled by the rising clock edge. Table B below shows the combinations which are possible for the integrated circuit 230 depending upon the position detected by the position detector logic which consists of the four orient circuits 238A through 238D.

TABLE B

| Rotation signal asserted | Data Orientation | |
| --- | --- | --- |
| | Input data pin | Output data pin |
| RotA | IA/OC | IB/OD |
| RotB | IB/OD | IC/OA |
| RotC | IC/OA | ID/OB |
| RotD | ID/OB | IA/OC |

Figure 7B:
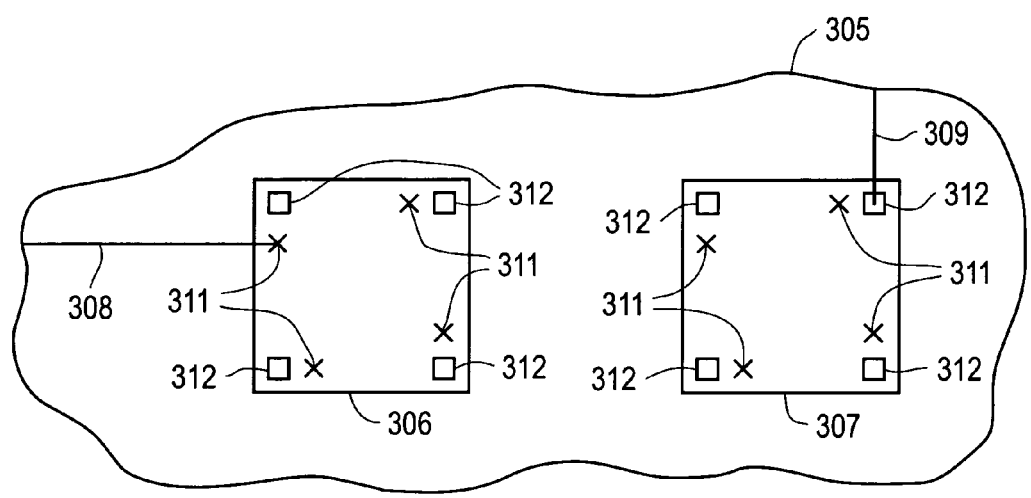
FIG. 7B shows an example of a receptor substrate with two blocks, each having an integrated circuit deposited (e.g. through fluidic self-assembly) into openings in the receptor substrate.
Figure 7C:
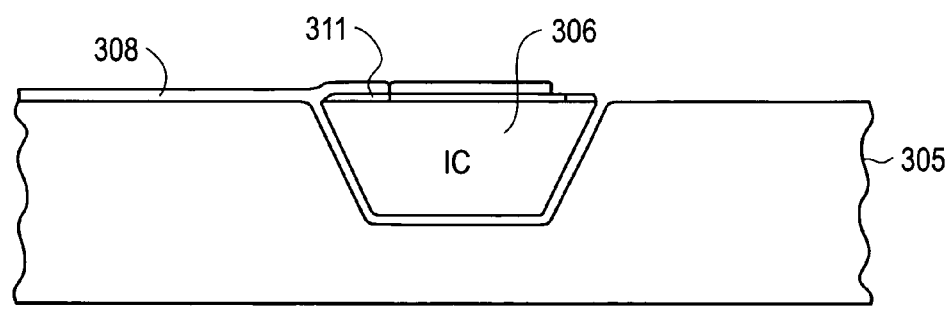
FIG. 7C shows a cross-sectional view of a portion of the receiving substrate of FIG. 7B.

FIG. 7A shows one example of using position information specified by a receiving substrate to indicate to an integrated circuit which function or functions the circuit is to provide. FIG. 7B shows an alternative embodiment in which the translational position on a receiving substrate 305 specifies the functionality to be provided by the integrated circuit. As shown in FIG. 7B, the receiving substrate 305 includes a signal line 309 which is designed to connect to bonding pads on the integrated circuit deposited into the receiving substrate, which bonding pads are at the extreme corner of the integrated circuit. Signal line 308, on the other hand, is designed to be connected to the corresponding bonding pad which is next to the bonding pad at the corner as shown in FIG. 7B. Thus, the integrated circuit 306, which can be deposited in any one of four rotational orientations into the receiving substrate 305, has interface pads 311 one of which will be coupled to a signal line 308 on the receiving substrate 305. This can be seen in the cross-sectional view of FIG. 7C in which the IC 306 has been deposited into the receiving substrate 305 (e.g. such as through a fluidic self-assembly process) and then a metallization or other conductive layer 308 is provided on top of the IC 306 and on top of the receptor substrate 305 in order to make an electrical interconnect with the pad 311. This will cause the integrated circuit to perform a desired function in the position into which is has fallen while integrated circuit 307 may perform a different function as specified by its position through the signal line 309 which is coupled to the pads 312 at the extreme corners of the integrated circuit. Thus, the same integrated circuit may be fabricated in multiple instances and removed from a wafer and then dispersed over a receiving substrate in a fluidic self-assembly process and the various circuits will fall into different positions but provide different functions based upon those positions as indicated by the corresponding signal lines on the receiving substrate.

As noted above, each integrated circuit may provide one function determined by its position or multiple functions determined by its position. Further, the position may select between one of two or more functions such that only that one function is performed. It will be appreciated that the signal lines, such as signal lines 308 or 309, may also provide programming signals to the electrical interface pads on the integrated circuits and these programming signals may determine the functionality provided by the circuitry within the integrated circuit depending upon the states of the programming signals. Thus, the pads at one point in time could provide one function and by changing the signal on the line or lines 309, a different set of functions may be provided.

Figure 8:
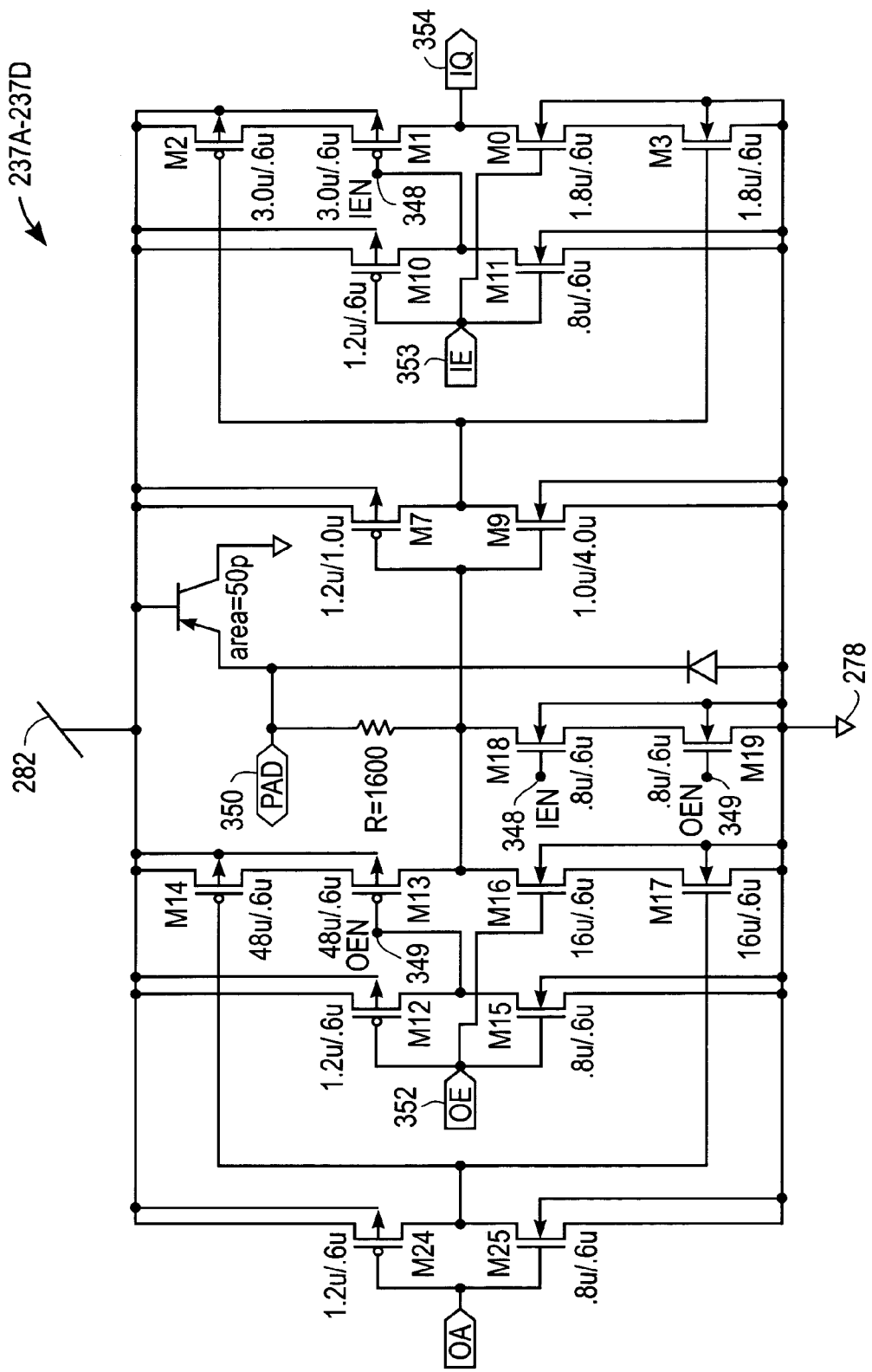
FIG. 8 shows an exemplary embodiment of a circuit which is within the integrated circuit shown in FIG. 4B.

FIG. 8 shows an example of an I/O controller circuit such as circuits 237A, or 237B, or 237C, or 237D of FIG. 4B. This circuit enables bi-directional capability for the digital data path through the integrated circuit 230. It includes input protection and output buffers capable of driving pads such as pads 239A, or 239B, or 239C, or 239D, depending on the particular I/O controller circuit. While it will be appreciated that the circuit shown in FIG. 8 represents any one of the I/O controllers 237A through 237D, the following description, for purposes of simplicity, will assume that the circuit of FIG. 8 is the I/O controller 237A which is coupled to the I/O pad 239A and to the shift buffer circuit 236A as shown in FIG. 4B. The input 353 of the circuit of FIG. 8 is the same as the input enable input of the I/O controller circuit 237A shown in FIG. 4B. The input 352 of FIG. 8 is the same as the output enable input of the I/O controller 237A as shown in FIG. 4B. Internal node 348 of FIG. 8 is the inverse of the input signal 353. Internal node 349 of FIG. 8 is the inverse of the input signal 352. The circuit of FIG. 8 is coupled to Vdd 282 and is also coupled to ground 278 as shown in FIG. 8. The pad 350 of FIG. 8 is the same as the pad input or output of the I/O controller 237A, which pad input or output is coupled to the electrical interface pad 239A as shown in FIG. 4B. The output 354 of the circuit of FIG. 8 is the same as the output which is labeled "input" of the I/O controller 237A shown in FIG. 4B. In other words, the output 354 from FIG. 8, when this circuit of FIG. 8 is the I/O controller 237A, is coupled to the pad in input of the shift buffer 236A. The input 351 of FIG. 8 is the same as the input which is labeled "output" of the I/O controller 237A. Again, assuming that the circuit of FIG. 8 is for purposes of this description the I/O controller 237A, then if the input enable signal is asserted by the rotate A pad such that the input 353 is high then the I/O controller provides a signal path from the pad 350 to the output 354, meaning that the I/O pad 239A is functioning as an input pad. On the other hand, if the output enable input 352 is asserted, then the I/O controller is providing a signal path from the input 351 to the pad 350 such that the I/O pad 239A is functioning as an output pad. Each of the corresponding I/O controllers 237B, 237C, and 237D operates in a similar manner depending upon the control signals which are applied to the corresponding inputs 352 and 353. The pad 350 will be placed in a no-operation state when neither input 352 and 353 is asserted. Thus, the I/O controllers of FIG. 4B provide for configuring its corresponding I/O pad (e.g. one of 239A, 239B, 239C, and 239D) as an either input pad or an output pad or a no-operation pad.

Figure 9A:
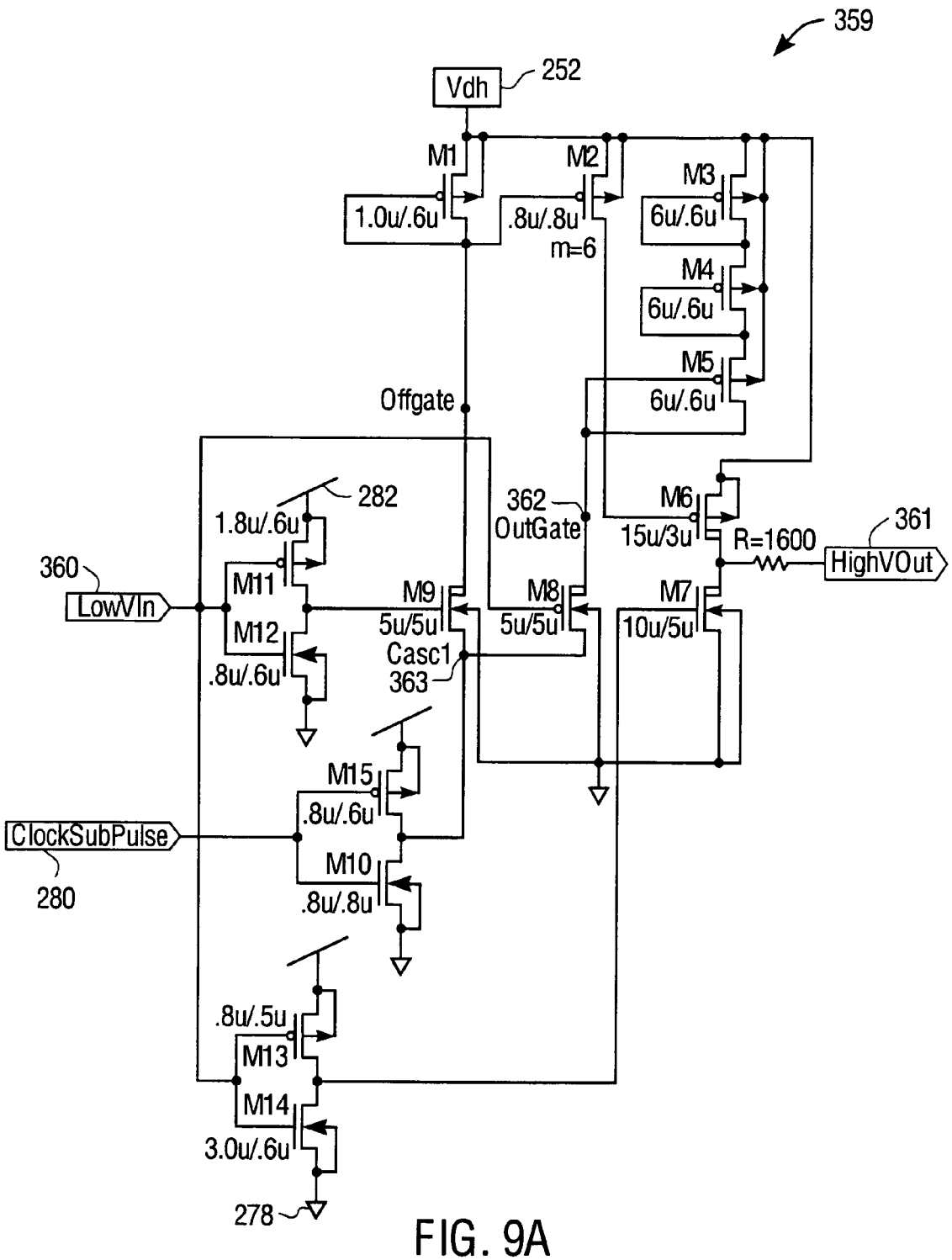
FIG. 9A shows an exemplary circuit according to one aspect of the invention, which circuit may be used in the integrated circuit shown in FIG. 4B.

FIG. 9A will now be referred to in describing yet another aspect of the present invention which provides an efficient, low power pulsed level shifting circuit according to one exemplary embodiment of this aspect. This circuit receives a low voltage input and also receives a clocked pulse signal.

The low input signal is applied to devices in a current mirror which is passing current through two current paths under control of the clocked pulse input. One of these current paths controls a node to change a state of a node which in turn drives a driver to a shifted voltage state relative to the input voltage state. This level shifting circuit is used within the drivers 235A, 235B, 235C and 235D in one embodiment of the present invention. This level shifting circuit allows for a low voltage value, such as 5 volts, to be shifted to a higher voltage value, such as 20 volts, in order to drive certain types of display media in one embodiment of the present invention.

In one embodiment, the circuit 359 includes an input to receive a clocked signal having a pulse during each clock cycle and a second input to receive a first voltage signal, such as a low voltage signal. A current mirror circuit is coupled to the first input and is also coupled to the second input, and the current mirror circuit controls a state of a node. An output driver is coupled to the node and the output driver shifts a voltage level from the first voltage signal to a second voltage signal when the node is in a first state. The current mirror includes a first current path and a second current path and a first control electrode, such as a gate electrode, which is coupled to the first current path. A second control electrode, such as a gate electrode, is coupled to the second current path and is coupled to the first control electrode. Typically, a transistor device which is a first transistor device in the first current path is substantially matched in size parameters to a second transistor device which is in the second current path. The pulse causes a current to flow in the second current path to set the node at the first state, and after the pulse, the node retains the first state with substantially no current flowing in the second current path. The level shifting circuit 359 receives an input low voltage signal at its input 360 and also receives a clocked pulse signal 280. Further, the circuit 359 receives Vdd 282 as shown in FIG. 9A and the ground signal 278. A current mirror formed by N channel FETs M8 and M9 and M10 are coupled together at node 363 which receives the output of a weak inverter formed by devices M10 and M15. M10 sets the current in M1 which determines a current in M2 and M8 and M9. M10 controls the current through node 363. The input to this inverter receives the pulsed clock signal 280, and this pulse controls the flow of current in the current mirror which charges a node 362. The node 362 controls the P channel FET M6 which controls the output of the state of the output 361. The current mirror circuit formed by the transistors M8 and M9 allows a communication between the low voltage section of the circuit and the high voltage section of the circuit without a large current consumption. Further, the pulses control the charging of the node 362 such that current flowing in the current mirror is substantially off when the signal 280 is low. An example of signal 280 is shown in FIG. 5A as signal 251.

Thus, the level shifter is driven in a pulsed manner with a periodic refreshing of the node 362 which in turn generates the output signal at output 361. The output 361 is driven to high which is a voltage derived from the Vdh input 252. When the input 360 is low the transistor M7 will be turned on, which will pull down the output 361 to substantially close to ground 278. This circuit 359 allows the control of a rail to rail high voltage signal (where the rail to rail transition is between Vdh and ground) using a much lower control voltage. Low power is consumed by modulating the current in the current mirror circuit by use of a very low duty cycle signal, in this case, the clock subpulse signal 280. The on and the off states of the low voltage input 360 are passed to the transistor M6 in a momentary fashion, and these on and off states are held on the transistor gate of transistor M6 for most of the operating cycle with no current through the current mirrors, which include the first current path and the second current path formed by the devices M8 and M9. Transistors M3 through M5 limit the gate/source voltage on M6 when switching M6 on. In an alternative embodiment, an additional device M16 may be coupled to M3 and to M1 to further reduce power consumption. M16 may be a P channel device (a P channel FET) having its gate coupled to the gate of M3 and having its source coupled to the source of M1 and its drain coupled to the drain of M1 and this device may be sized to be the same size as transistor M2.

Figure 10:
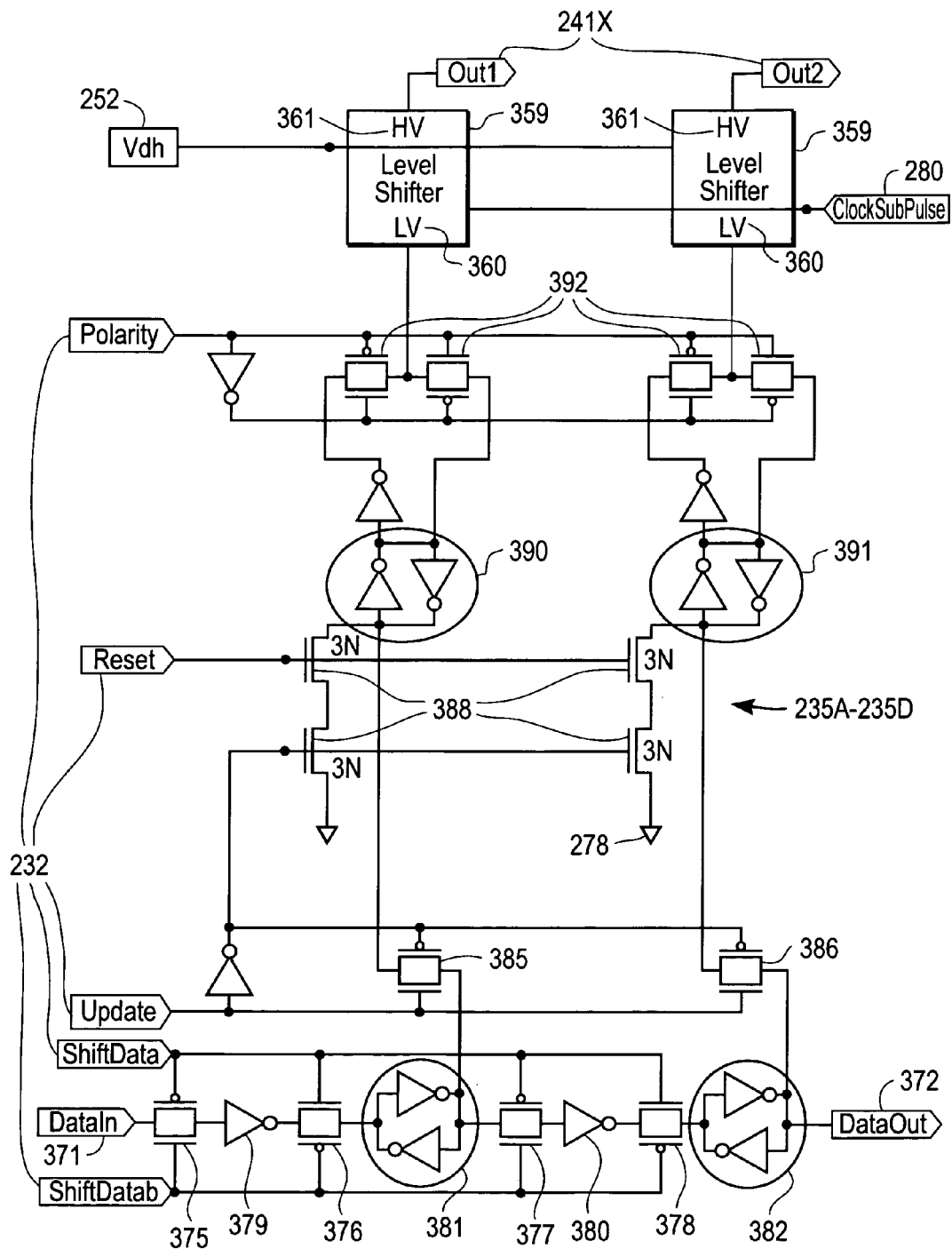
FIG. 10 shows an exemplary embodiment of a circuit used within the IC shown in FIG. 4B.

FIG. 10 shows an example of a driver circuit which may be used as the driver circuits 235A through 235D of FIG. 4B. Each driver circuit, such as circuits 235A through 235D, includes a two bit shift register, two buffer latches 390 and 391, exclusive OR gating for output inversion under control of a polarity signal, and two high voltage level shifters 359. The shift register timing is somewhat different from traditional shift registers in that due to power supply requirements, the data set up and hold times constitute most of the clock period, which creates a very small time in which the data can change. An internal delay in the shift buffer circuit (e.g. 236A–236D) prevents any race conditions which may occur in moving data from one IC 230 which is functioning as a display driver to another IC in the shifting of data between IC to IC. The buffer registers formed by latches 390 and 391 allow the outputs to be reset and updated simultaneously as well as holding the outputs constant during a data load into the latches 381 and 382. The level shifter circuits 359 convert the digital outputs to high voltage analog outputs to drive display segments such as pixel electrodes.

Each driver circuit, such as circuit 235A, receives signals from the control bus 232, such as the polarity signal or the reset signal. The reset signal is used to reset the pixels to a desired predetermined state and the polarity signal is used in those cases where the display media requires an inversion of the polarity of the signal over time (e.g. certain types of nematic liquid crystals require the polarity to be inverted over time as is well known in the art). The update signal from the control bus 232 causes pass gates 385 and 386 to allow the data outputs from the latches 381 and 382 to be inputted to the latches 390 and 391 which in turn drive the outputs 241X. The polarity signal controls the output through the pass gates 392 as shown in FIG. 10. The reset signal controls resetting of the state of the display pixels by activating the N channel FETs 388 to cause the inputs to the buffers 390 and 391 to be pulled to low. The shift data and shift data bar control signals are also from the control bus 232 and are used to control shifting of data through the shift register serial bus 233 internally within the IC 230. It will be appreciated that along at least a row of the display or a portion of the row of the display, multiple ICs such as ICs 230 will be receiving these shift data and shift data bar commands to cause the pixel data to be shifted through multiple ICs along the row as well as internally within the IC 230. The input 371 (data in) corresponds to the data in input on each of the drivers 235A through 235D. The output 372 corresponds to the data out output of each of the drivers 235A through 235D. It will be appreciated that buffer registers 381 and 382 are stages or elements within the shift register and these stages are separated by the pass gates such as pass gates 375, 376, 377, and 378. Inverters 379 and 380 are also part of the shift register as shown in FIG. 10.

Figure 12A:
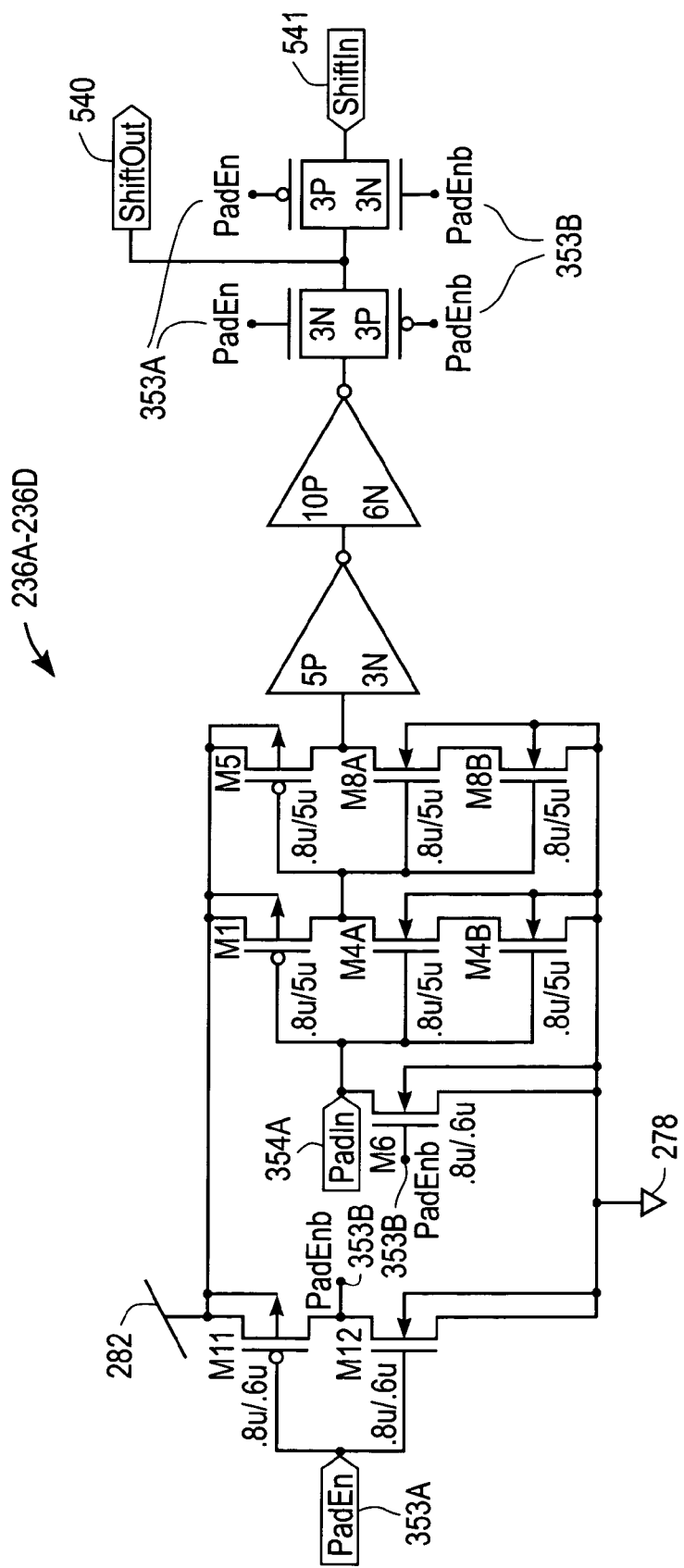
FIG. 12A shows an example of a circuit which may be used in the integrated circuit shown in FIG. 4B.

FIG. 12A shows an example of a shift buffer circuit which may be used for each of the shift buffer circuits 236A, 236B, 236C, and 236D shown in FIG. 4B. The shift output 540 of FIG. 12A is the same as the shift out output of each shift buffer circuit 236A through 236D. The shift in input 541 of FIG. 12A is the same as the shift in input of each shift buffer circuit 236A through 236D shown in FIG. 4B. The input 353A receives its signal from the input enable input of the I/O controller which is coupled to the corresponding shift buffer. For example, in the case of the shift buffer 236A of FIG. 4B, the input 353A is coupled to the input enable input of I/O controller 237A which is the input 353 shown in FIG. 8. The input 354A of FIG. 12A is coupled to the output 354 of the I/O controller circuit shown in FIG. 8. Internal node 353B of FIG. 12A is derived from inverting the signal at the input 353A. The shift buffer circuit of FIG. 12A allows shifting through the serial bus 233 except for one point determined by the position detector logic which, as described above, electrically disconnects the serial ring formed initially by the bus 233.

Figure 11B:
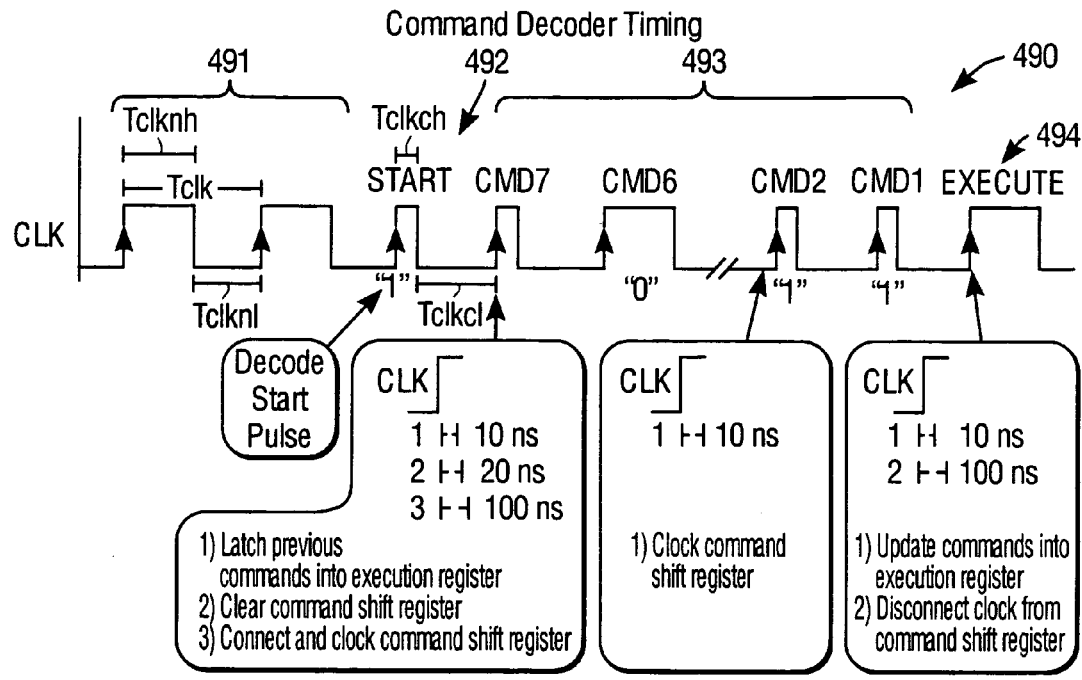
FIG. 11B shows a timing waveform for use with circuits shown in FIG. 4B.

FIGS. 11A, 11B, 11C, 11D, and 11E will now be referred to in describing the command decoder circuit 231 as well as the overall operation of the integrated circuit 230 when used as a display driver in a display such as the display shown in FIG. 3D. It will also be appreciated that the integrated circuit 230 may be used in non-display systems or systems which are displays and input systems (e.g. touch screen input) such as the system 550 shown in FIG. 13A. The command decoder circuit 231 includes a seven bit command shift register (formed by latches 416, 417, 418, 419, 420, 421, and 422) and a four bit execution register formed by latches created by inverter pairs 430, inverter pair 431, inverter pair 432, and inverter pair 433. The command decoder circuit 231 also includes a clock pulse detection logic (timing discriminator 408) and register control logic such as the command decoder status register 407 and the command awake sequence generator. The timing discriminator 408 receives the clock R signal 401, which signal 401 is also used to generate internal signals 403 and 403A which are used within the command decoder circuit 231. The clock subpulse signal 280 is used to generate two signals 404A and 404 which are also used within the command decoder circuit 231 as shown in FIG. 11A. For example, the NAND gate 415 receives the signal 404 and also receives the signal 409 which is the command clock enable signal from the command awake sequence generator. Normal duty cycle clock signals, such as those shown as 491 in FIG. 11B, maintain the clock data node 402 at a low state. A short clock pulse, such as pulse 492 shown in FIG. 11B, causes the clock data node 402 to generate a high signal which, as will be described below, causes the command decoder status register 407 to generate the signals 406 and 406A to "awaken" the command decoder circuit 231. The signal 406 is applied as an input to the command awake sequence generator as shown in FIG. 11A to generate the command clock enable signal 409 and the command shift clear signal 410. The second NAND gate in the command awake sequence generator which generates the signal 410 also receives the power on reset bar signal 283A. The clock data node 402 is coupled to the pass gate 405 and is also coupled to the input of the command shift register, the first latch of which is latch 416. Conventional pass gates and inverters are used throughout the command shift register as shown in FIG. 11A to create a shift register. The last stage of the shift register is the stop bit latch formed by the pair of inverters 423. The output of this stop bit latch provides a signal 411 which is inputted to the command decoder status register logic 407. The command clock enable signal 409 is provided to one input of the NAND 415 and the signal 404 is provided as the other input to NAND 415. P channel FET 447 receives the signal 410 which is used to clear the command shift register at the beginning of an awakening of the command decoder circuit 231. This signal 410 is also coupled to the gates of the P channel FETs 440 through 446 to clear each of the latches 416 though 422 such that their output states are low (zero). Pass gates 425, 426, 427, and 428 are enabled when signals 406 and 406A are set such that the outputs CMD1 through CMD4 are provided to the input of the latches in the command storage register. The outputs from these command storage registers are then provided to the control bus 232 as shown in FIG. 11A.

Figure 11C:
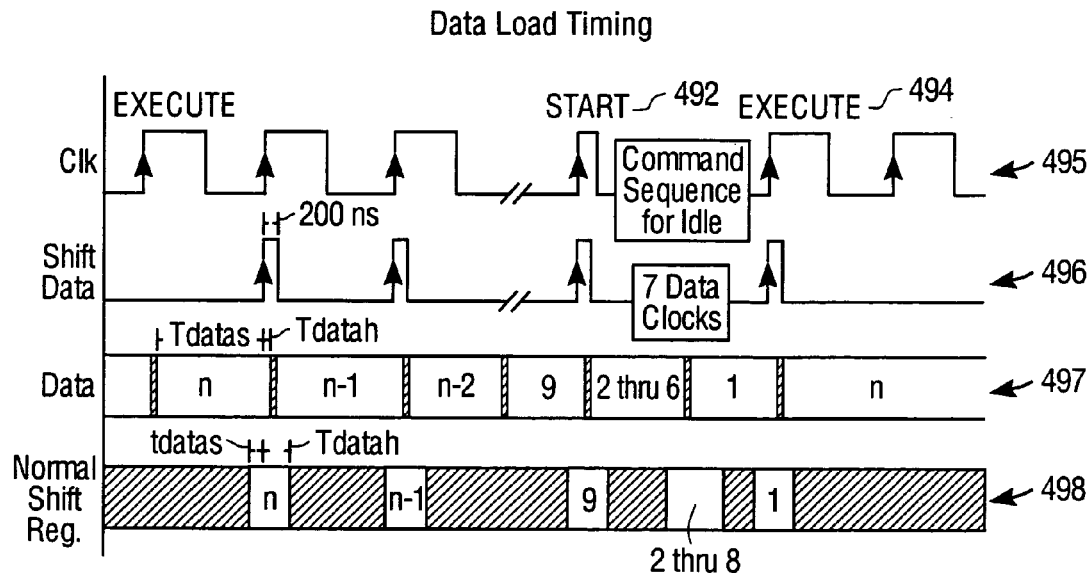
FIG. 11C shows an exemplary embodiment of timing waveforms which may be used in conjunction with the circuits shown in FIG. 4B.
Figure 11D:
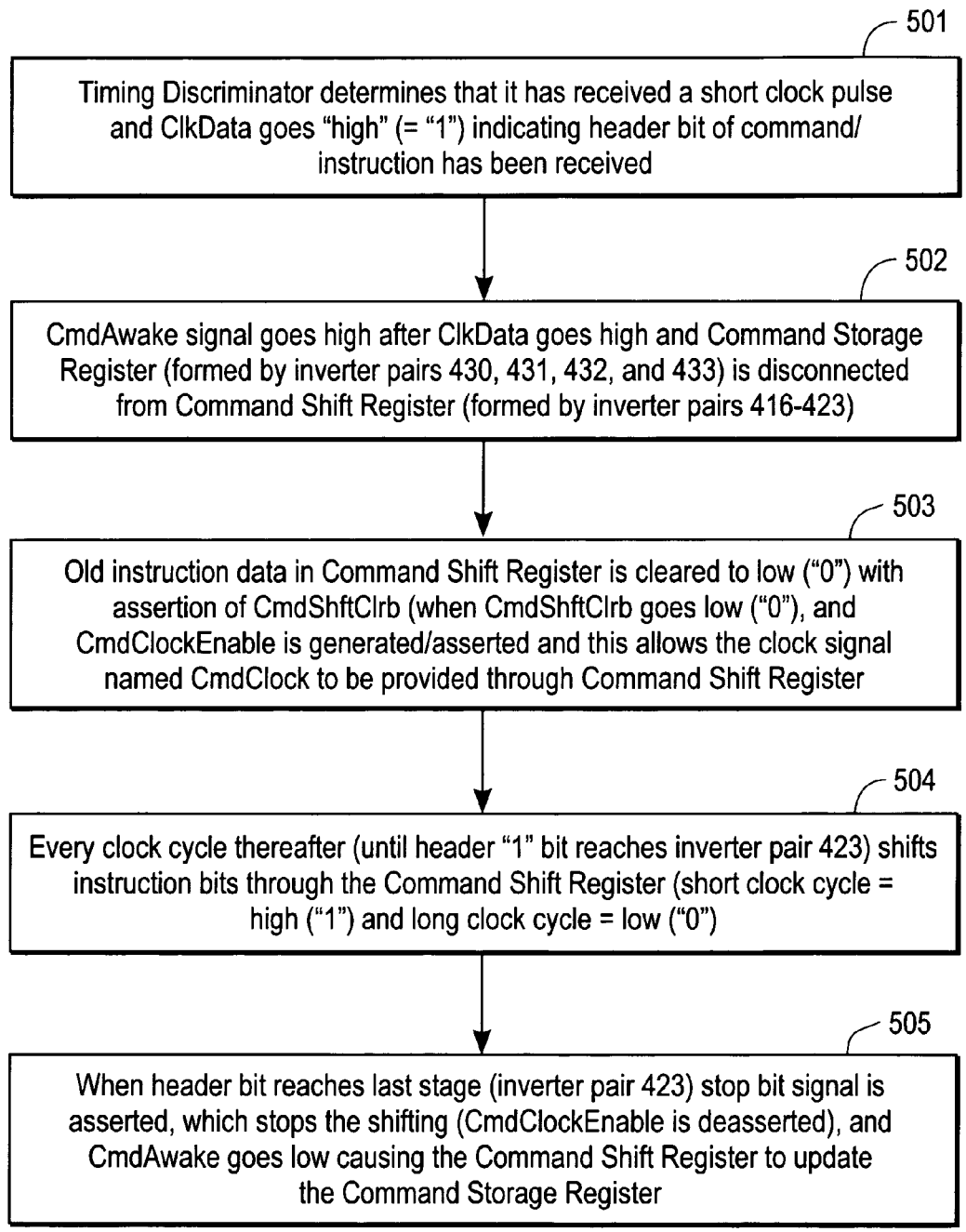
FIG. 11D is a flowchart which depicts one embodiment of the operation of a command decoder used in the integrated circuit shown in FIG. 4B.

The incoming clock has two states: (1) normal operation with a 50% duty cycle (see clock signal 491 shown in FIG. 11B), and (2) a command sequence operation with a 7% duty cycle (e.g. see pulse 492 shown in FIG. 11B). The timing discriminator 408 detects the beginning of a command sequence by looking for the initial short clock pulse, such as pulse 492. The loading of a command into the command decoder circuit 231 is further shown in FIGS. 11B and 11D. In operation 501, the timing discriminator 408 determines that it has received a short clock pulse and the clock data node 402 goes high, indicating the header bit of the command/instruction has been received. In operation 502, command awake signal 406 goes high after the clock data signal 402 goes high and the command storage register (formed by inverter pairs 430 through 433) is disconnected from the command shift register (formed by inverter pairs 416 through 423). Thus the output commands stored in the command storage register are not affected by the new incoming command data stream. Then in operation 503, old instruction data in the command shift register is cleared to low with the assertion of the command shift clear bar signal 410. When the command shift bar signal goes low, then the command clock enable signal 409 is asserted (by going high) and this allows the clock signal referred to as command clock (and its inverse, command clock bar) to be provided to the command shift register in order to clock the commands serially through the command shift register. It will be appreciated that the commands 1 through 7 are loaded in reverse order as shown by the sequence 493 (shown in FIG. 11B) which represents the command loading sequence 490. Every clock cycle generated through the NAND gate 415 shifts instruction bits through the command shift register from left to right as shown in FIG. 11A. A short clock pulse at the clock data node 402 which represents the input to the command shift register represents a 1 or high bit and a long clock pulse bit represents a low or 0 bit. Thus, command 6 shown in FIG. 11B is low while command 2 shown in FIG. 11B is high. In operation 505, the initial start pulse 492 is a header bit which reaches the last stage (inverter pair 423) causing the stop bit signal to be asserted which stops the shifting by deasserting the command clock enable signal 409, and the command awake signal 406 goes low causing the command shift register to update the command storage register. Then normal execution follows as shown by phase 494 in FIG. 11B. Typically, this normal phase involves data loading and the display of data as shown in FIG. 11C. Tables C and D below show the various commands according to one embodiment of the present invention and the functions provided by these commands.

TABLE C

Command Code Sequence

| Command # in sequence | Programmed Command |
|---|---|
| 1 | Load |
| 2 | Update |
| 3 | Polarity |
| 4 | Reset |
| 5 | Unused |
| 6 | Unused |
| 7 | Unused |

Note: Command data is loaded serially from command #7 down to command #1.

TABLE D

Command Code

| Load | Update | Invert | Reset | Function |
|---|---|---|---|---|
| 0 | 0 | 0 | 0 | *** |
| 0 | 0 | 0 | 1 | *** |
| 0 | 0 | 1 | 0 | *** |
| 0 | 0 | 1 | 1 | *** |
| 0 | 1 | 0 | 0 | Data is loaded into data shift registers |
| 0 | 1 | 0 | 1 | Outputs are reset to zero state while loading data shift register |
| 0 | 1 | 1 | 0 | Current outputs are inverted while loading data shift register |
| 0 | 1 | 1 | 1 | All outputs set high while data is loaded into data shift register |
| 1 | 0 | 0 | 0 | Outputs are latched with current data |
| 1 | 0 | 0 | 1 | ** |
| 1 | 0 | 1 | 0 | Outputs will be refreshed with current data and inverted |
| 1 | 0 | 1 | 1 | ** |
| 1 | 1 | 0 | 0 | No Changes |
| 1 | 1 | 0 | 1 | Outputs are reset to zero state |
| 1 | 1 | 1 | 0 | Outputs are complimented |
| 1 | 1 | 1 | 1 | All outputs will be set high |

**This command sequence would clear and load data simultaneously, resulting in incorrect display data. This is also a high power condition in the output driver.
***Loading data while updating display would cause the display to temporarily display the incorrect data.

The four possible commands used in the output drivers (e.g. 235A–235D) are:

1. load/idle—(active low). When low, this command allows a pulsed version of the incoming clock to pass to the output data shift registers and clocks in serial data on the rising edge.

2. update/freeze—(active low). When low, this command allows the data loaded in the output shift registers to be latched into the buffer register. This register is directly connected to the inverter and high voltage output level shifters.

3. polarity (+/−). The polarity command allows all the outputs to be inverted to facilitate driving the display segments symmetrically.

4. reset. When asserted, this command will clear all contents of the data buffer registers without affecting the data loaded in the output shift registers of the drivers, such as display driver circuit 235A.

Figure 11E:
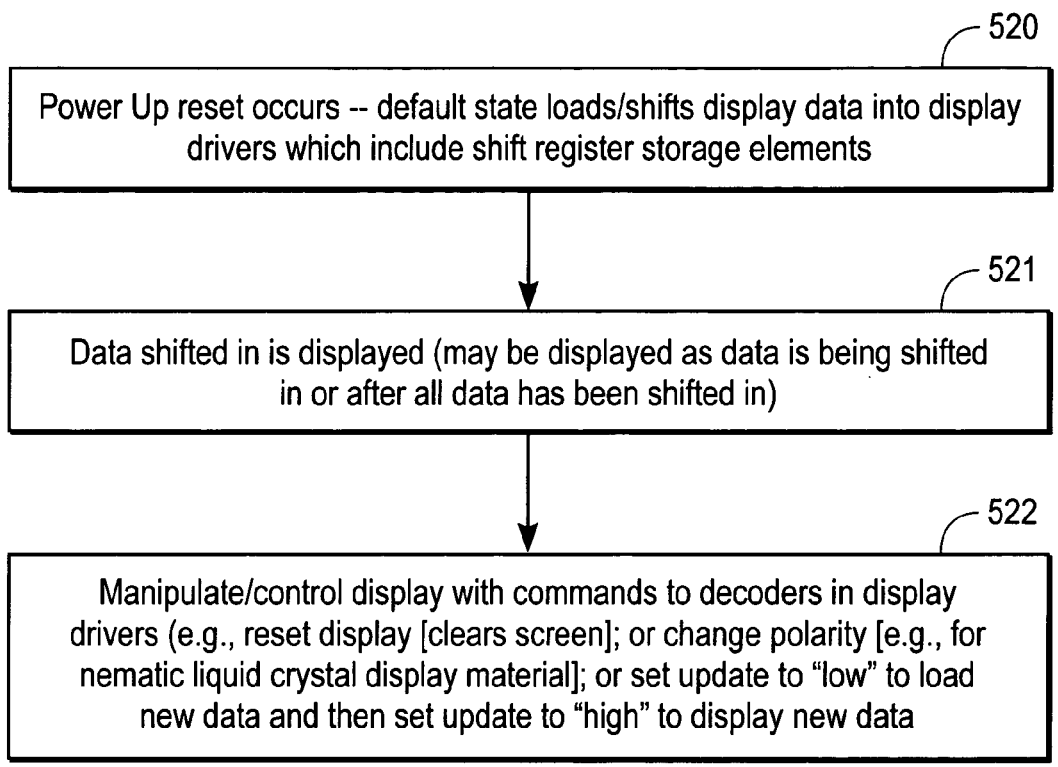
FIG. 11E shows an exemplary flowchart of one method of operating a display according to the present invention.

FIG. 11E shows one exemplary method of operating a display which uses a plurality of integrated circuits 230 such as the arrangement shown in FIG. 3D. In the exemplary method shown in FIG. 11E, operation 520 begins with a power up reset which places the display drivers in a default state in which display data is shifted into the display drivers, each of which include the shift register storage elements within the driver circuits, such as driver circuits 235A through 235D. In operation 521, data is shifted in and as it is shifted in, it is displayed. Alternatively, the pixels can be set in a cleared state so that the display is blank or a homogeneous appearance until all data has been shifted in. After all data has been shifted in, in operation 522 the display may be manipulated or controlled with commands to the decoders in the display drivers. For example, the display may be reset again to clear the display or the polarity may be changed in those instances where this is required or new data may be loaded for a new image to be displayed by setting update to low and loading the new data and then setting update to high to display the new data.

Figure 13A:
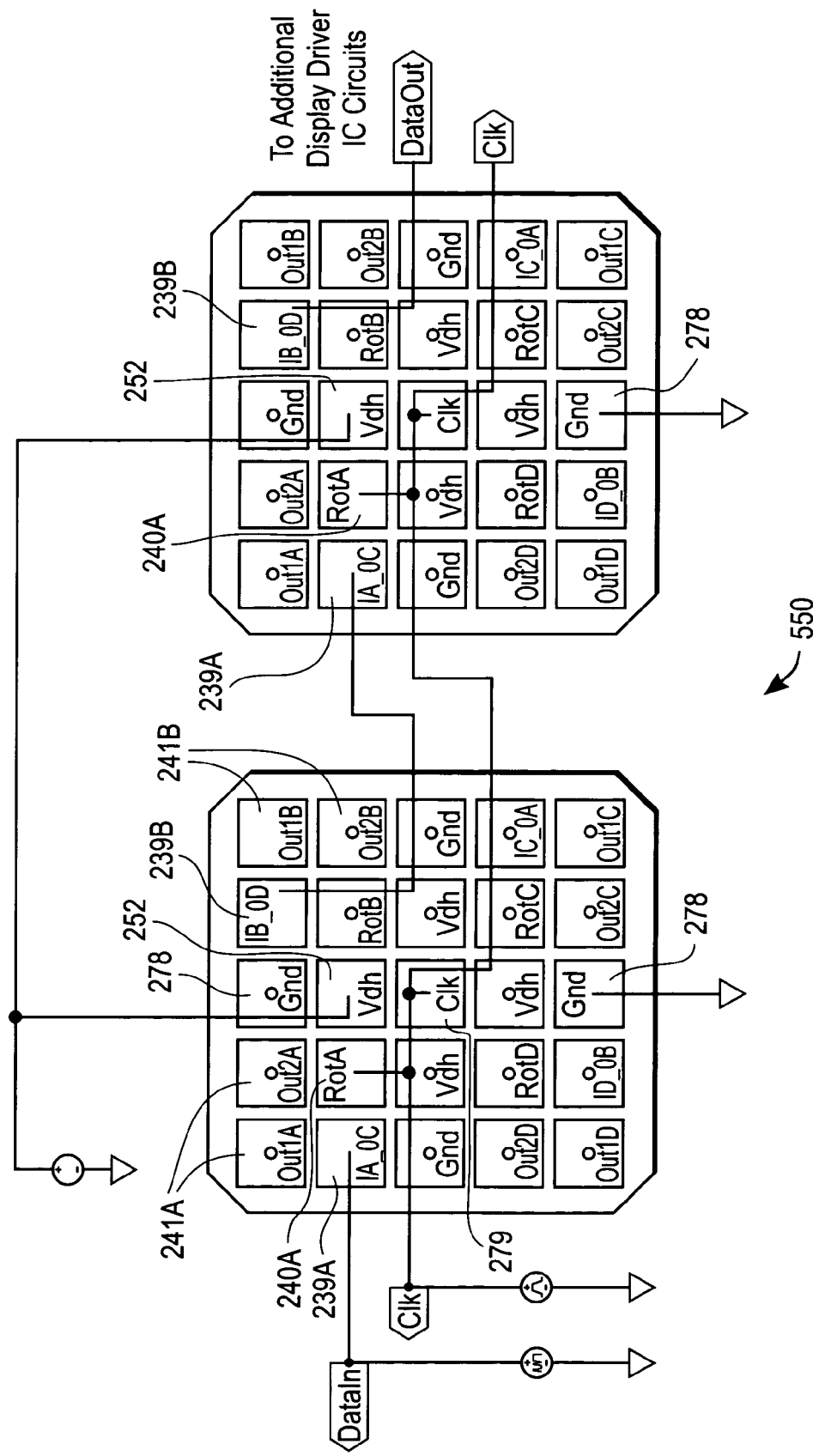
FIG. 13A illustrates the interconnection of multiple display driver ICs, where each IC may be the same as that shown in FIG. 4B.

FIG. 13A shows the interconnection of two integrated circuits 230 according to one exemplary embodiment of the present invention. As noted above, the clock and data signals are bussed substantially along only one axis of the display. Further, there is no physical crossing over of the interconnections on the receiving substrate which holds the integrated circuits 230.

Figure 14A:
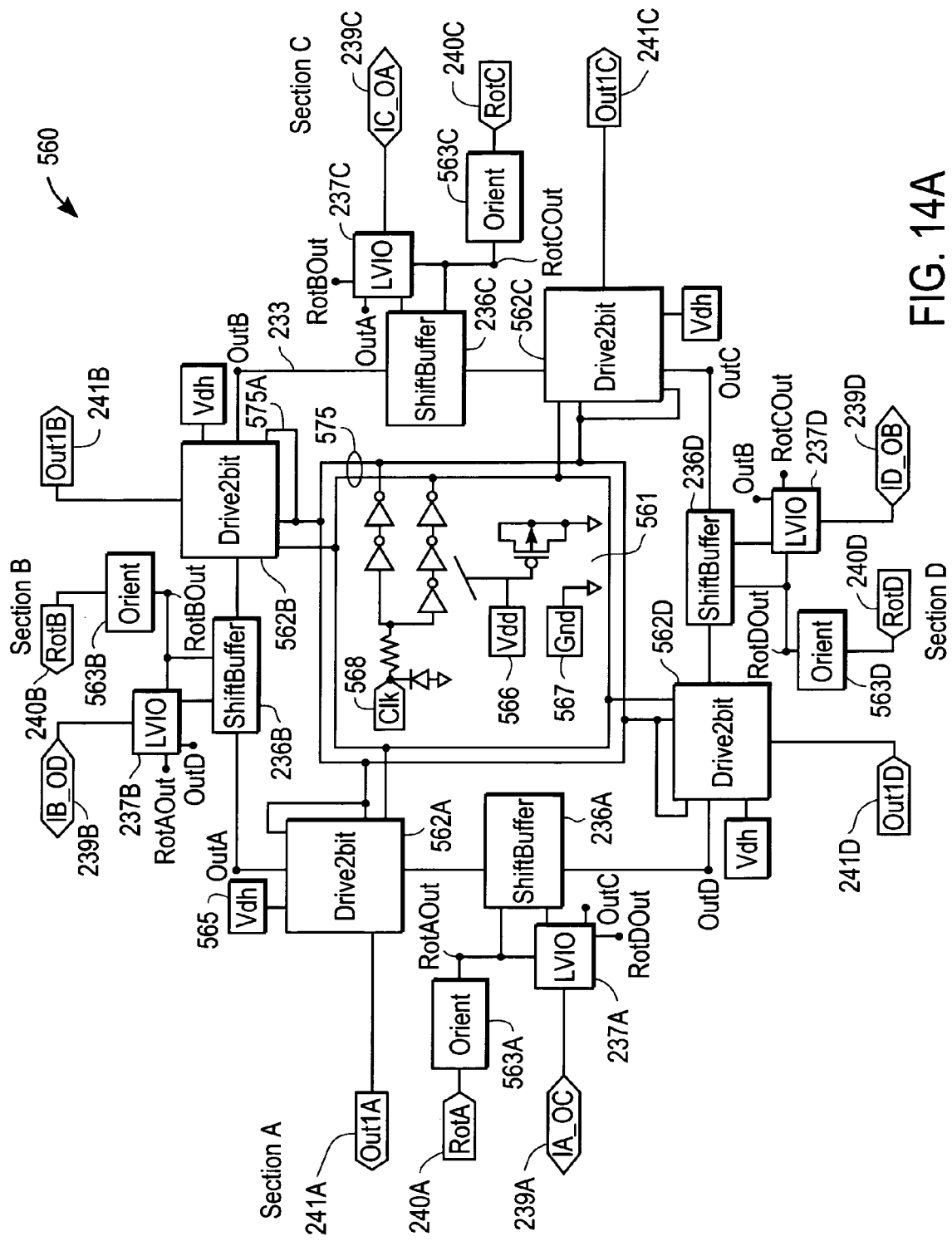
FIG. 14A illustrates an alternative embodiment of an integrated circuit which may be used according to one aspect of the present invention.
Figure 14B:
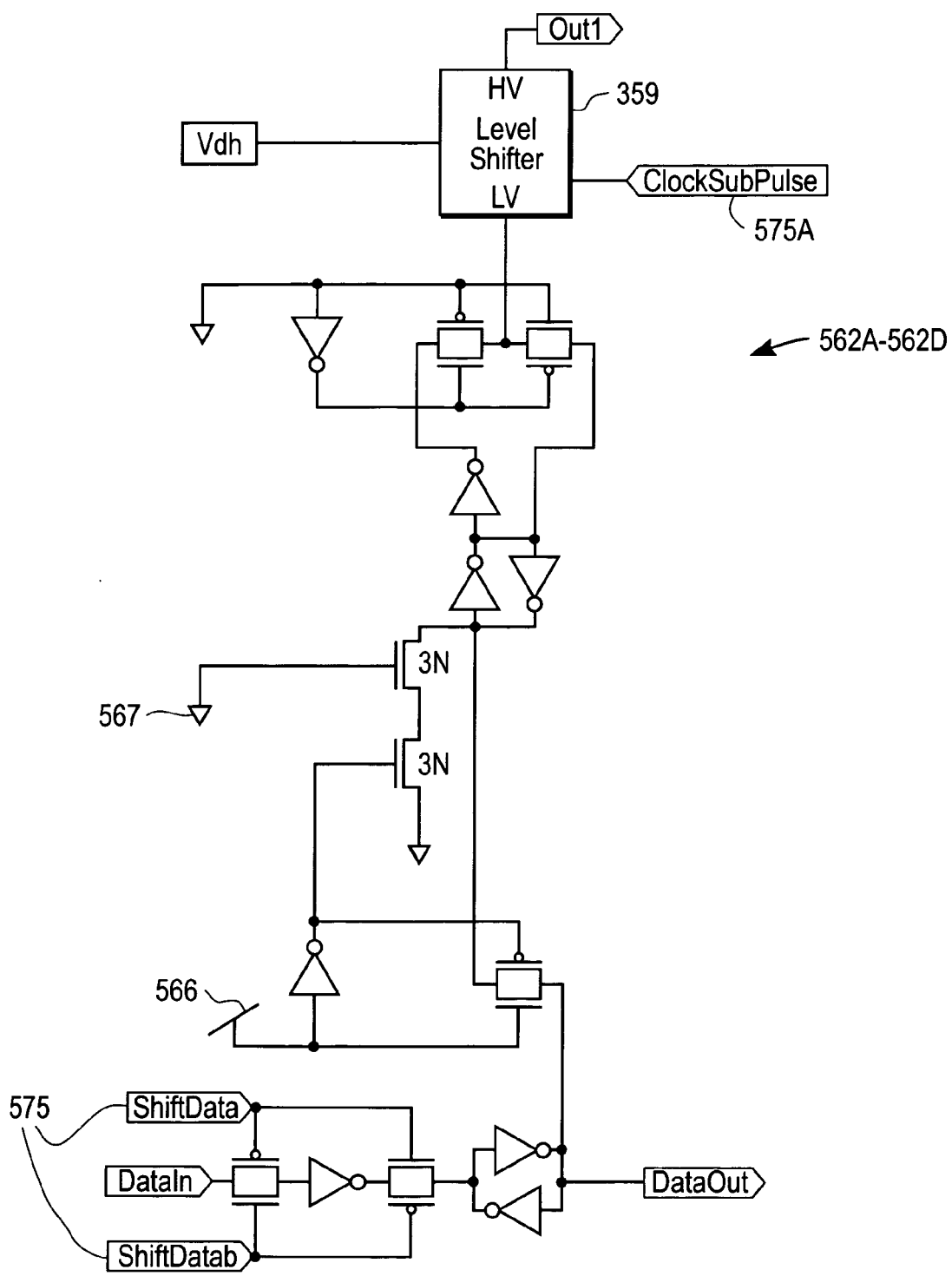
FIG. 14B illustrates an exemplary circuit which may be used within the integrated circuit shown in FIG. 14A.
Figure 14C:
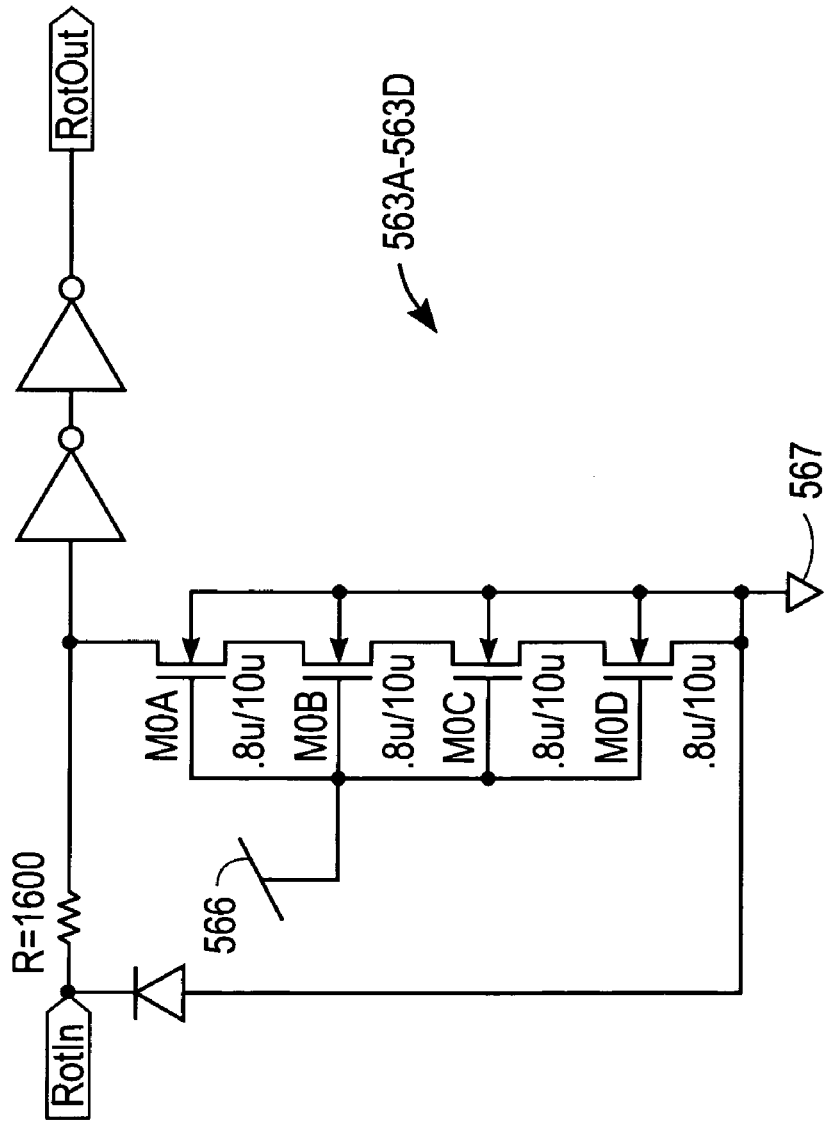
FIG. 14C is an example of a circuit which may be used in the integrated circuit shown in FIG. 14A.
Figure 14D:
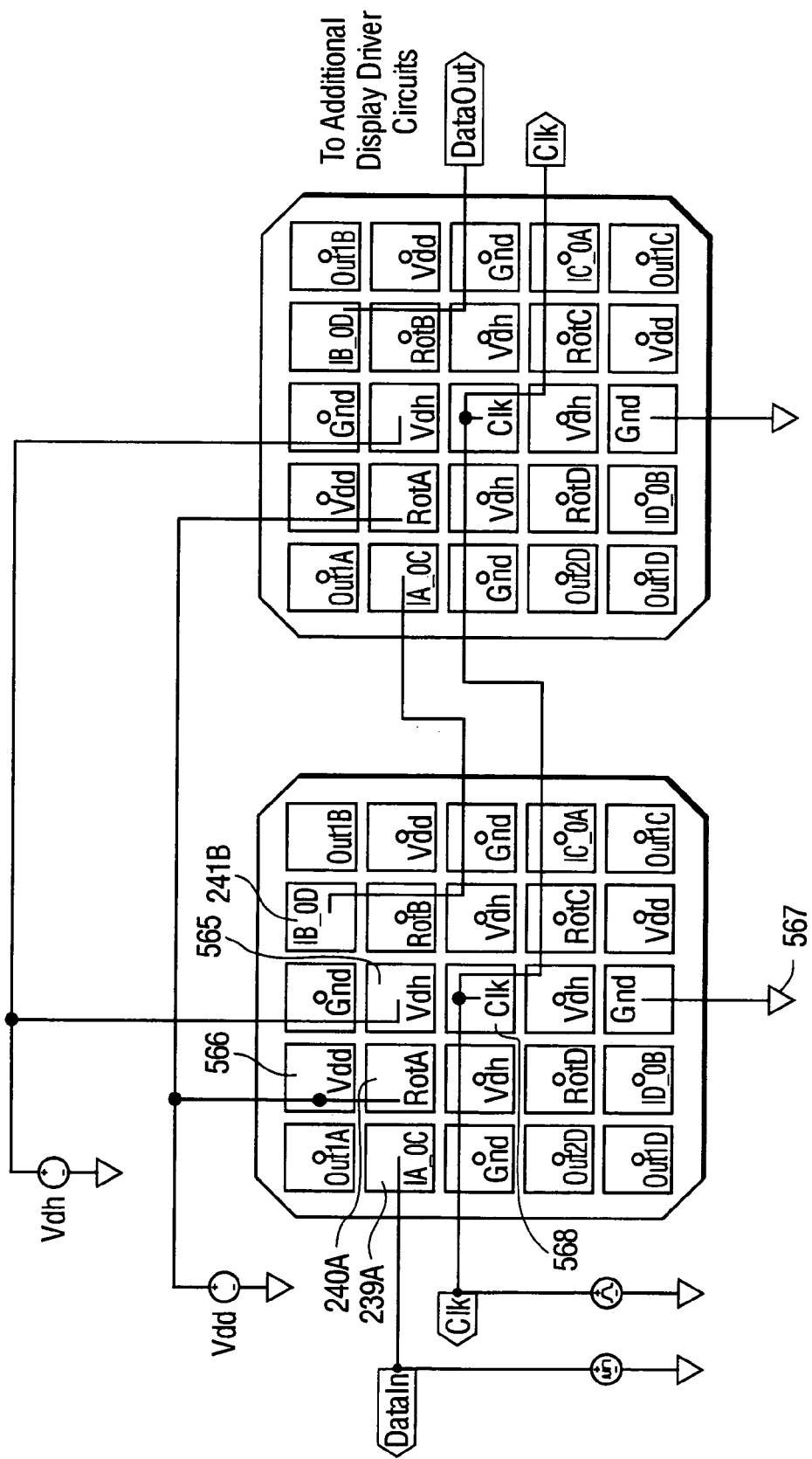
FIG. 14D shows the interconnection between multiple integrated circuits, such as multiple instances of the integrated circuit shown in FIG. 14A.

FIGS. 14A, 14B, 14C, and 14D indicate an alternative embodiment of an integrated circuit 560 which is similar to integrated circuit 230 except it is less complex as can be seen from these figures. Many of the same components/circuits in the integrated circuit 230 are also used in the integrated circuit 560. However, the command decoder circuit 231 is replaced by control circuit 561 which includes a simplified control bus 575. This integrated circuit receives a clock signal 568, a Vdd signal 566, and a ground signal 567. This integrated circuit is capable of driving four outputs but does include configurable I/O pads such as the pads 239A through 239D. This integrated circuit 560 also includes position detecting logic shown as circuits 563A through 563D. The driver circuits 562A through 562D are simplified and are shown in FIG. 14B. The position detection circuits are also simplified and shown in FIG. 14C. The integrated circuit 560 can be coupled together with other similar integrated circuits in the manner shown in FIG. 14D to form a display driver or other types of devices. In one embodiment, the display driver shifts data horizontally or vertically along substantially one axis of the display.

Figure 15A:
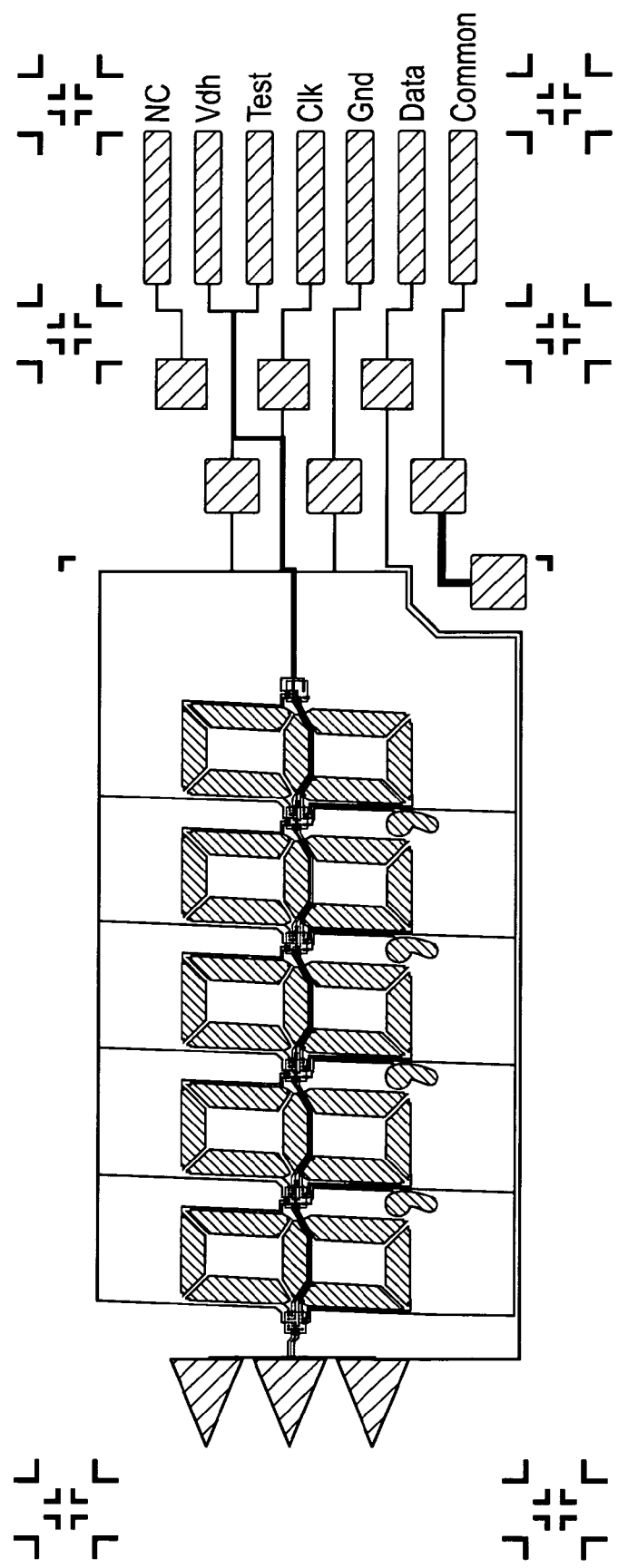
FIG. 15A shows the layout of a display device according to one embodiment of the present invention and FIG. 15B shows an enlarged view of this layout.
Figure 15B:
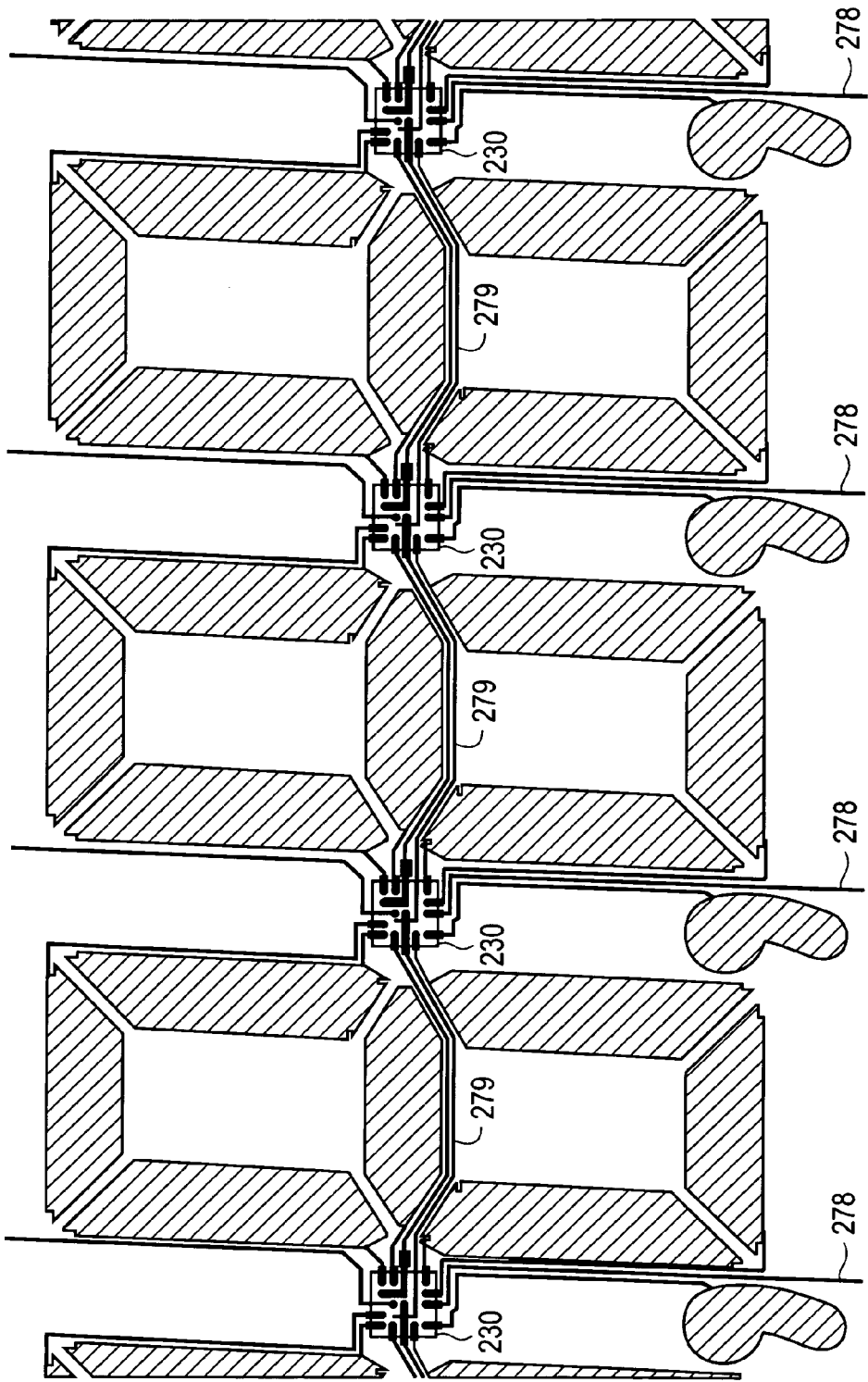

FIG. 15A shows an example of one particular embodiment of a display device using the integrated circuit 230. This display device may, in one embodiment, be a flexible display for use in a smart card type credit card. In the example shown in FIG. 15A, a single layer of conductive interconnect, in this case a metal interconnect, is used to interconnect the pixel electrodes and the integrated circuits 230 without requiring another layer of interconnect and an intervening insulating layer, thus greatly simplifying a roll to roll/web process for manufacturing a flexible display. According to one process for manufacturing this smart card display, a receiving substrate is a flexible plastic material into which holes are formed for the openings for the integrated circuits 230. The flexible receiving substrate is strung from one roll (e.g. a beginning roll) to another roll (e.g. an ending roll) and is moved through rollers in a process which includes a fluidic self-assembly process for causing the integrated circuits 230 to be deposited into openings in the flexible receiving substrate. Then an interconnect layer, which may be a separate flexible material also manufactured in a roll to roll/web process, may be applied to the receiving substrate after the integrated circuits 230 have been deposited into the openings. This will form the interconnect of the display device, allowing it to function with multiple pixel electrodes and multiple integrated circuits 230. The use of only a single electrically conductive interconnect layer to form the electrical connections between pixel electrodes and display drivers greatly reduces the manufacturing complexity and cost. No insulating layer to separate stacked electrical interconnect layers is needed and no alignment to vias in this insulating layer is needed. FIG. 15B shows an enlarged view of FIG. 15A so that the conductive lines can be more easily seen. The embodiment of FIG. 15A is similar to the embodiments shown in FIGS. 2C and 3C.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An assembly comprising:
 a receptor substrate having a conductive layer disposed over at least a portion of said receptor substrate;
 an integrated circuit (IC) attached to said receptor substrate and having a plurality of interface pads, including at least one interface pad which is coupled to said conductive layer to receive a signal from said conductive layer, said IC also comprising:
  a first logic circuit coupled to a first set said interface pads and providing a first function;
  a second logic circuit coupled to a second set of said interface pads and providing a second function which is different than said first function;
  a selector logic circuit coupled to said first logic circuit and coupled to said second logic circuit and coupled to receive said signal which causes said selector logic to select between said first function and said second function such that said IC performs only one of said first and said second functions.

2. An assembly as in claim 1 wherein said IC is attached to said receptor substrate through a fluidic self-assembly process, and wherein said first set and said second set of interface pads overlap at least partially.

3. An assembly as in claim 1 wherein said signal is determined by a position of said IC on said receptor substrate.

4. An assembly as in claim 3 wherein said position determines whether said IC provides said first function or said second function at said position.

5. An assembly as in claim 1 wherein said signal is a programming instruction which selects between said first and said second functions.

6. An assembly as in claim 1 wherein said first function is a sensing function and said second function is a presentation function.

7. An assembly as in claim 6 wherein said sensing function senses a touch of a user and said presentation function displays data to said user.

\* \* \* \* \*